United States Patent
Taniguchi

(10) Patent No.: US 6,753,948 B2
(45) Date of Patent: Jun. 22, 2004

(54) SCANNING EXPOSURE METHOD AND APPARATUS

(75) Inventor: Tetsuo Taniguchi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/268,907

(22) Filed: Oct. 11, 2002

(65) Prior Publication Data

US 2003/0035090 A1 Feb. 20, 2003

Related U.S. Application Data

(63) Continuation of application No. 09/150,006, filed on Sep. 9, 1998, now abandoned, which is a continuation of application No. 08/533,923, filed on Sep. 26, 1995, now abandoned, which is a continuation-in-part of application No. 08/506,367, filed on Jul. 24, 1995, now abandoned, which is a continuation of application No. 08/233,319, filed on Apr. 26, 1994, now abandoned.

(30) Foreign Application Priority Data

Apr. 27, 1993 (JP) ............................................. 5-100621
Aug. 12, 1993 (JP) ............................................. 5-200911
Feb. 9, 1995 (JP) ................................................ 7-21455

(51) Int. Cl.[7] .......................... G03B 27/72; G03B 27/54
(52) U.S. Cl. ......................................... 355/71; 355/67
(58) Field of Search ........................... 355/53, 55, 67, 355/71, 52

(56) References Cited

U.S. PATENT DOCUMENTS

| 4,496,239 A | 1/1985 | Isohata et al. ................. 355/53 |
|---|---|---|
| 4,558,949 A | 12/1985 | Uehara et al. ............... 356/152 |
| 4,598,197 A | 7/1986 | Morita et al. ................ 250/205 |
| 4,650,983 A | 3/1987 | Suwa .......................... 250/204 |
| 4,666,273 A | 5/1987 | Shimizu et al. ............. 353/101 |
| 4,687,322 A | 8/1987 | Tanimoto et al. ............. 355/55 |
| 4,734,746 A | 3/1988 | Ushida et al. ................. 355/53 |
| 4,780,617 A | 10/1988 | Umatate et al. ............. 250/548 |
| 4,780,747 A | 10/1988 | Suzuki et al. ................. 355/68 |
| 4,822,975 A | 4/1989 | Torigoe ................. 219/121.85 |
| 4,871,237 A | 10/1989 | Anzai et al. ................. 350/419 |
| 4,884,101 A | 11/1989 | Tanimoto ..................... 355/68 |
| 4,920,505 A | 4/1990 | Suzuki ....................... 364/525 |

(List continued on next page.)

FOREIGN PATENT DOCUMENTS

| JP | 61-91662 | 5/1986 |
|---|---|---|
| JP | 63-128713 | 6/1988 |
| JP | 2-297918 | 12/1990 |
| JP | 4-196513 | 7/1992 |
| JP | 4-225514 | 8/1992 |
| JP | 5-62878 | 3/1993 |
| JP | 5-29129 | 4/1993 |

OTHER PUBLICATIONS

Buckley, Jere D., "Expanding the Horizons of Optical Projection Lithography", *Solid State Technology*, pp. 77–82, May, 1982.

Primary Examiner—Russell Adams
Assistant Examiner—D. Ben Esplin
(74) Attorney, Agent, or Firm—Miles & Stockbridge P.C.

(57) ABSTRACT

An apparatus is provided with an illumination optical system for irradiating illumination light from a light source onto a predetermined illumination area on a mask and a projection optical system for projecting a pattern formed on the mask onto a photosensitive substrate. The apparatus synchronously moves the mask and the substrate in predetermined scanning directions perpendicular to an optical axis of the projection optical system thereby to effect scanning exposure of a projected image of the pattern on the substrate. The apparatus comprises a device for inputting information on a distortion of a pattern having been already formed on the substrate, in a direction perpendicular to the scanning directions, and a device for controlling imaging characteristics of the projection optical system, based on the information thus input.

16 Claims, 13 Drawing Sheets

U.S. PATENT DOCUMENTS

| | | | |
|---|---|---|---|
| 4,924,257 A | 5/1990 | Jain | 355/53 |
| 5,097,291 A | 3/1992 | Suzuki | 355/69 |
| 5,117,255 A * | 5/1992 | Shiraishi et al. | 355/53 |
| 5,160,962 A | 11/1992 | Miura et al. | 355/53 |
| 5,168,304 A | 12/1992 | Hattori | 355/53 |
| 5,194,893 A | 3/1993 | Nishi | 355/53 |
| 5,227,839 A | 7/1993 | Allen | 355/53 |
| 5,270,771 A | 12/1993 | Sato | 355/53 |
| 5,281,996 A | 1/1994 | Bruning et al. | 355/77 |
| 5,286,963 A | 2/1994 | Torigoe | 355/201.2 |
| 5,291,240 A | 3/1994 | Jain | 355/53 |
| 5,337,097 A | 8/1994 | Suzuki et al. | 353/101 |
| 5,343,270 A | 8/1994 | Sakakibara et al. | 355/53 |
| 5,459,547 A * | 10/1995 | Shiozawa | 355/67 |
| 5,473,410 A | 12/1995 | Nishi | 355/53 |
| 5,477,304 A * | 12/1995 | Nishi | 355/53 |
| 5,483,311 A | 1/1996 | Sakakibara et al. | 355/53 |
| 5,486,896 A * | 1/1996 | Hazama et al. | 355/71 |
| 5,506,684 A | 4/1996 | Ota et al. | 356/401 |
| 5,591,958 A | 1/1997 | Nishi et al. | 250/205 |
| 5,662,410 A * | 9/1997 | Suganuma | 362/268 |
| 5,721,608 A | 2/1998 | Taniguchi | 355/53 |
| 6,051,842 A * | 4/2000 | Yamamoto | 250/548 |
| 6,078,380 A | 6/2000 | Taniguchi et al. | 355/52 |
| 6,317,195 B1 | 11/2001 | Taniguchi | 355/53 |

* cited by examiner

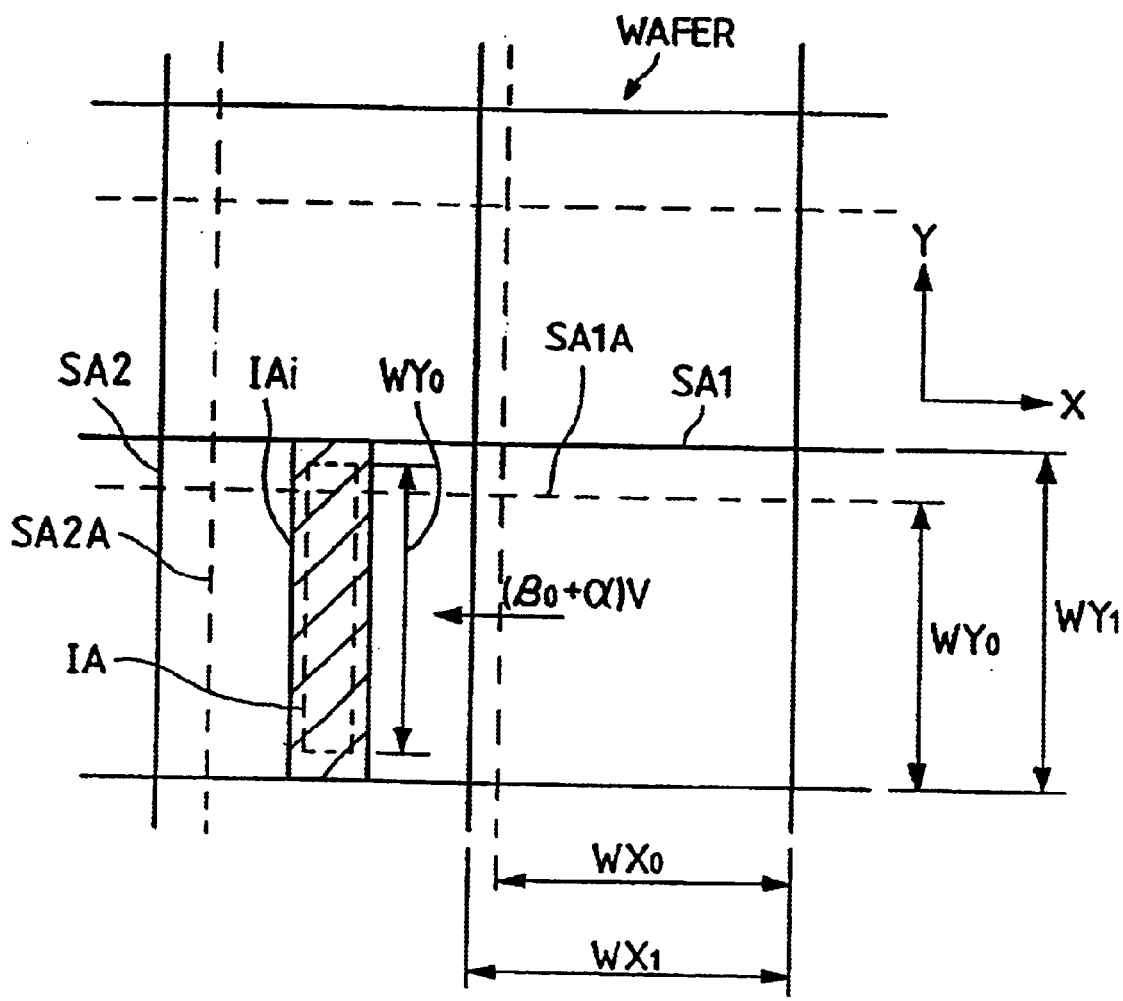

SCAN DR

SCANNING EXPOSURE METHOD AND APPARATUS

CROSS-REFERENCE TO RELATED APPLICATIONS

This application is a continuation of application Ser. No. 09/150,006 filed Sep. 9, 1998 now abandoned; which is a continuation of application Ser. No. 08/533,923 filed Sep. 26, 1995 now abandoned, which is a continuation-in-part of application Ser. No. 08/506,367 filed Jul. 24, 1995 now abandoned, which is a continuation of application Ser. No. 08/233,319 filed Apr. 26, 1994 now abandoned.

BACKGROUND OF THE INVENTION

1. Field of the Invention

The present invention relates to an exposure apparatus which is used in the photolithography process for manufacturing microdevices, such as semiconductor elements, or liquid crystal elements, image pick-up elements (CCD), thin film magnetic heads, opto-magnetic discs, etc., and in particular, to a scanning exposure apparatus of the so-called slit scan method, the step and scan method, or the like, which scans a mask and a photosensitive substrate in synchronization so as to perform exposure of said substrate with a pattern image of said mask.

2. Related Background Art

In producing semiconductor elements or liquid crystal display elements by the photolithography process, a projection exposure apparatus is used for projecting an image of a pattern on a photomask or a reticle (the both will be hereinafter referred to as "reticle") through a projection optical system onto a substrate (a wafer, a glass plate, or the like) on which a coating of photoresist or the like is given, and thereby effecting exposure of the image on the substrate. Such a projection exposure apparatus is required to perform such accurate overlay exposure that a presently exposed reticle pattern is accurately overlaid across the entire exposure field over a chip pattern on the substrate such as a wafer, which was formed by previous exposure and process treatments. Namely, it is necessary that the exposure is conducted while keeping high overlay accuracy between the pattern formed on the substrate and the pattern of the reticle.

A semiconductor element or the like is normally constructed in lamination of many layers of circuit patterns overlaid on a substrate. For example, if the circuit patterns in the layers are formed using different projection exposure apparatus and if there is a difference exceeding a predetermined acceptable value between a magnification error of a projection exposure apparatus which performed previous exposure of a circuit pattern in a previous layer and a magnification error of a projection exposure apparatus which is to perform present exposure of a circuit pattern in a next layer, the overlay accuracy is degraded so as to lower the yield of semiconductor elements. Also, an overlay error occurs if there is a difference in distortion of projected image of mask pattern between two projection exposure apparatus. There is also a case in which a substrate is distorted by heating due to various process treatments after exposure, which results in distorting a previously exposed pattern. The distortion of pattern in this case will eventually be similar to the distortion of projected image caused by a previously used projection exposure apparatus.

Concerning this, conventional projection exposure apparatus were generally apparatus (steppers) of the full exposure method (or "full field method") which projected a reduced image of reticle pattern over the entire exposure field on a photosensitive substrate by one operation. In applications with such projection exposure apparatus of the full exposure method, imaging properties of a projection optical system are actively adjusted by driving some lens elements in the projection optical system or a reticle along the optical axis or inclining it with respect to the optical axis for example to change a projection magnification of projected pattern or to distort the projected pattern in the form of trapezoid or barrel. As described, there are suggestions for the method in which exposure is effected while the distortion of projected image of presently exposed pattern is kept correspondent to that of previously exposed pattern (see U.S. Pat. Nos. 4,734,746 and 5,117,255).

The suggestions for improvement in overlay accuracy as described above were made under a premise of use of the full exposure method (full field method). However, a recent trend is to increase the size of a chip pattern of semiconductor element, which requires the projection exposure apparatus to increase an exposure area, for permitting a pattern with a larger area on the reticle to be exposed on the photosensitive substrate. To handle the larger area exposure of transferred pattern and the limit of exposure field of projection optical system, there are suggested projection exposure apparatus of the so-called slit scan exposure method, which moves the reticle and the photosensitive substrate in synchronization relative to a rectangular, arcuate or hexagonal illumination area (hereinafter referred to as "slit illumination area"), for example, whereby patterns with a larger area than the slit illumination area on the reticle are successively projected and exposed on the substrate.

The scanning exposure method has such advantages that illumination uniformity on the reticle (or a wafer) is improved, a distortion, a curvature of the image field, astigmatism, and the like of the projection optical system are reduced, and the uniformity of focusing position in the exposure field is improved, because the illumination area on the reticle in the slit scan exposure method is smaller than that in the full exposure method. Also, the slit scan exposure method has another advantage that large area exposure is possible in the scanning directions of the reticle and the substrate without being affected by the limit of field size of projection optical system.

The conventional projection exposure apparatus of the slit scan exposure method as described above, however, had such a disadvantage that if the magnification error was simply corrected only by the projection optical system, the magnification error could be corrected in the non-scanning direction perpendicular to the scanning direction, but the magnification error could not be fully corrected in the scanning direction.

In addition, since the conventional projection exposure apparatus of the slit scan exposure method have the width of slit illumination area in the scanning direction different from that in the non-scanning direction, they are likely to have a difference between the magnification error in the scanning direction and the magnification error in the non-scanning direction in each shot area because of a bias of heat distribution caused by absorption of exposure light in the projection optical system and because of a difference between a shot size in the scanning direction and a shot size in the non-scanning direction on the substrate. Accordingly, it is to be desired that the apparatus are arranged to correct the magnification error in the scanning direction and the magnification error in the non-scanning direction independently of each other in particular.

Further, since the conventional slit scan exposure method uses only a part of field of the projection optical system and a same pattern passes through a plurality of portions in the field of projection optical system upon scanning exposure, it cannot be possible to distort the projected image as a whole in the trapezoidal shape or in the barrel shape by simply inclining a lens element in the projection optical system.

The method for improving the overlay accuracy in the slit scan exposure method as described above is disclosed for example in Japanese Patent Publication No. 5-29129. The projection optical system in the exposure apparatus as disclosed in the publication is of the reflection type, using only mirrors such as a concave mirror and a convex mirror. Also, the mask and the substrate are held on a single scanning member (scanning frame) so that they are moved together in a same direction.

An amount of positional deviation between the mask and the substrate is measured at a plurality of portions during movement of the mask and the substrate. A fine feed mechanism for adjusting the position of wafer by a fine amount is driven based on the detection result to change a relative position between the mask and the substrate.

The above conventional technology, however, simply adjusts the position of wafer by a fine amount and has a disadvantage that, for example, if a shot area on the substrate is distorted in a trapezoidal shape or in a barrel shape, the pattern of mask cannot be overlaid with accuracy as a whole on a shot area.

Further, the scanning exposure method has such a disadvantage that the image quality may be deteriorated by a scanning exposure, depending on a distortion of a projected image due to an aberration of the projection optical system. This deterioration in the image quality will be specifically described with reference to FIGS. 15A to 15C. In FIGS. 15A to 15C, a scanning direction of the photosensitive substrate is represented by +x direction (or −x direction), while a non-scanning direction perpendicular to the x direction is y direction. When a projection optical system has no aberration, an exposure field of said projection optical system (i.e., a projected image with no distortion) is a rectangular exposure area 141 having the width of D in the x direction.

When the rectangular exposure area 141 is deformed into an exposure area 142A in the form of a parallelogram which is inclined by the angle γ[rad] with respect to the axis x due to an aberration of the projection optical system, as shown in FIG. 15A, if the photosensitive substrate is scanned in the x direction, the projected image is moved to the non-scanning direction (y direction) on the photosensitive substrate only by D·γ or around while one point on the photosensitive substrate intersects the exposure area 142A, thereby deteriorating the quality of the image. Also, when the projection magnification with respect to the scanning direction (x direction) of the projection optical system is shifted by β, the exposure area 141 having the width D is deformed into an exposure area 142B having the width (1+β) D, as shown in FIG. 15B. In this case, since the projected image is moved on the photosensitive substrate in the scanning direction in excess by β·D while the one point on the photosensitive substrate intersects the area having the width D within the exposure area 142B along the x direction, the image quality is also deteriorated.

Further, when the projection magnification of the projection system varies in the non-scanning direction and the sides of the exposure area 141 extending in the scanning direction are symmetrically inclined by the angle δ[rad], respectively, so that said exposure area 141 is deformed into an exposure area 142C in the form of trapezoid, as shown in FIG. 15C, the projected image is moved on the photosensitive substrate in the non-scanning direction by D·δ at the maximum while one point on the photosensitive substrate intersects the exposure area 142C along the x direction, which also results in image deterioration.

Here, a pattern on the reticle is a line-and-space pattern which is arranged periodically in the scanning direction, the pitch of the projected image of said pattern on the photosensitive substrate in the x direction is denoted by p, and this pitch p is about two times as much as the exposure wave length. In this case, the light intensity distribution I(x) of said projected image can be expressed by $I\cos\{(2\pi/p)\cdot x\}$. If, as an extreme example, only an optical image is synthesized by shifting a phase of a projected image thereof by $\Delta/2$, the light intensity distribution of said optical image IT(x) is expressed as follows:

$$IT(x) = (1/2)[I\cos\{(2\pi/p)x - \Delta/2\} + I\cos\{(2\pi/p)x + \Delta/2\}]$$
$$= I\cos(\Delta/2)\cos\{(2\pi/p)\cdot x\}$$

As clearly seen from the above equation, a contrast of said synthetic image is decreased to $\cos(\Delta/2)$ times as much a contrast as the original projected image. Thus, a degree of resolution of the synthetic image is lowered, which results in deterioration of the image quality.

The distortion of the projected image shown in FIGS. 15A to 15C is an anisotropic distortion which is differently distorted for each direction. On the contrary, when the distortion of said projected image is isotropic, that is, when only the projection magnification varies, the deterioration in the image quality caused by a change in the magnification can be easily coped with by, for example, regulating a ratio between a scanning speed of the reticle and that of the photosensitive substrate.

SUMMARY OF THE INVENTION

It is an object of the present invention to provide a scanning exposure method and apparatus capable of overlaying exposure with high accuracy.

It is another object of the present invention to provide a scanning exposure method and apparatus which can independently correct a magnification error between a pattern image of the mask and a processing area on the photosensitive substrate in a scanning direction and the non-scanning direction.

It is still another object of the present invention to provide a scanning exposure method and apparatus which can form the pattern image of the mask in a processing area on the photosensitive substrate without deteriorating the image quality even if said processing has been deformed.

It is still another object of the present invention to provide a scanning exposure method and apparatus which does not deteriorate the quality of an image exposed on the photosensitive substrate (degree of resolution) even when a projected image by the projection optical system is anisotropically deformed.

It is still another object of the present invention to provide a method of manufacturing microdevices with high accuracy by performing the scanning exposure of the photosensitive substrate with the pattern image of the mask.

A scanning projection exposure apparatus according to the present invention, for example as shown in FIG. 1, is an apparatus provided with an illumination optical system (1-10) for irradiating illumination light from a light source onto a predetermined illumination area on a mask (R) and a projection optical system (PL) for projecting a pattern formed on said mask (R) onto a photosensitive substrate (W), which synchronously moves said mask (R) and said substrate (W) in predetermined scanning directions perpendicular to an optical axis (AX) of said projection optical system (PL) thereby to effect scanning exposure of a projected image of said pattern on said substrate (W), comprising:

means (16) for inputting information on a distortion of a pattern having been already formed on said substrate (W), in a direction perpendicular to said scanning directions; and means (35) for controlling imaging properties of said projection optical system, based on said information thus input.

The apparatus of the present invention preliminarily obtains a state of a distortion for example of a chip pattern having been already formed on the substrate (W), in the direction perpendicular to the scanning directions. It can be obtained for example by detecting alignment marks provided around the chip pattern by means of distortion detecting means (30, 31). Or, characteristics of a distortion of projected image by an exposure apparatus for previous exposure may be input through input means (22). Then, in accordance with the state of distortion of the pattern on the substrate in the direction perpendicular to the scanning directions, the imaging properties control means (34, 35, 36) drives a lens element in the projection optical system (PL) or controls the pressure or the temperature of gas in a hermetically sealed space between some lenses, for example. This permits the projected image of the pattern on the mask to be overlaid with high accuracy on the pattern on the substrate in the direction perpendicular to the scanning directions.

Another scanning projection exposure apparatus according to the present invention, for example as shown in FIG. 1, is an apparatus provided with an illumination optical system (1-10) for irradiating illumination light from a light source onto a predetermined illumination area on a mask (R) and a projection optical system (PL) for projecting a pattern formed on said mask (R) onto a photosensitive substrate (W), which synchronously moves said mask (R) and said substrate (R) in predetermined scanning directions perpendicular to an optical axis (AX) of said projection optical system (PL) thereby to effect scanning exposure of a projected image of said pattern on said substrate (W), comprising:

input means (22) for inputting information on a distortion of a pattern having been already formed on said substrate (W);

first means (34, 35, 36) for controlling imaging properties of said projection optical system (PL) in accordance with said information thus input; and second means (16, 17, 25) for controlling a relative scanning speed between said mask (R) and said substrate (W) in accordance with said information thus input;

wherein in said scanning exposure, a projection magnification of said projected image in said scanning directions is adjusted through said second means (16, 17, 25) and a projection magnification of said projected image is isotropically or anisotropically adjusted through said first means (34, 35, 36), whereby said projected image is overlaid on said pattern having been already formed on said substrate (W).

A further scanning projection exposure apparatus of the present invention is an apparatus provided with an illumination optical system (1-10) for irradiating illumination light from a light source onto a predetermined illumination area on a mask (R) and a projection optical system (PL) for projecting a pattern formed on said mask (R) onto a photosensitive substrate (W), which synchronously moves said mask (R) and said substrate (W) in predetermined scanning directions perpendicular to an optical axis (AX) of said projection optical system (PL) thereby to effect scanning exposure of a projected image of said pattern on said substrate (W), comprising:

distortion detecting means (30, 31) for detecting a state of a distortion of a pattern having been already formed on said substrate (W);

first means (34, 35, 36) for controlling imaging properties of said projection optical system (PL) based on a detection result of said distortion detecting means (30, 31); and second means (16, 17, 25) for controlling a relative scanning speed between said mask (R) and said substrate (W) based on the detection result of said distortion detecting means (30, 31);

wherein in said scanning exposure, a projection magnification of said projected image in said scanning directions is adjusted through said second means (16, 17, 25) and a projection magnification of said projected image is isotropically or anisotropically adjusted through said first means (34, 35, 36), whereby said projected image is overlaid on said pattern having been already formed on said substrate (W).

The apparatus of the present invention preliminarily obtains a state of a distortion of a chip pattern having been already formed on the substrate (W), for example. This can be done by detecting the state of the distortion of the pattern on the substrate by the distortion detecting means (30, 31) or by inputting characteristics of the distortion of projected image by an exposure apparatus for previous exposure through the input means (22). Then, in accordance with the state of distortion of the pattern on the substrate, the first means (34, 35, 36) drives a lens element in the projection optical system (PL) or controls the pressure or the temperature of gas in a hermetically sealed space between some lenses, for example. This can adjust a projection magnification of the projected image of the pattern on the mask in the direction perpendicular to the scanning directions. Also, the second means (16, 17, 25) adjusts a relative speed between the mask (R) and the substrate (W) in accordance with the state of distortion of the pattern on the substrate. This can adjust a projection magnification of the projected image of the pattern on the mask in the scanning directions.

For example, consider a case in which only a magnification component of the pattern on the substrate is changed as shown in FIG. 6. Letting $\beta_0$ be a projection magnification of the projection optical system and V be a scanning speed of the mask in its scanning direction (referred to as "−X direction"), a scanning speed of the substrate in the X direction is defined as $\beta_0 V$. If a magnification error of the pattern on the substrate in the scanning direction is α and a magnification error in the direction perpendicular to the scanning direction is γ, the main control system (16) sets the projection magnification of projection optical system to $(\beta_0+\gamma)$ and the scanning speed of the substrate upon scanning exposure to $(\beta_0+\alpha)V$. By this, the projected image of the pattern on the mask can be accurately overlaid on the pattern on the substrate.

Also, for example in case a pattern on the substrate is distorted in a trapezoidal shape as shown in FIG. 8 or in FIG.

9, the projected image of the pattern on the mask can be overlaid with high accuracy on the pattern on the substrate in accordance therewith by controlling the imaging properties of projection optical system (PL) so as to distort the projected image of the pattern on the mask and continuously changing the imaging properties of the projection optical system and the scanning speed of the substrate during scanning exposure.

A scanning exposure method according to the present invention is arranged, with respect to a projection optical system for projecting a pattern image on the mask to the photosensitive substrate, to scan the mask in a predetermined direction intersecting the optical axis of said projection optical system while scanning the substrate in a direction corresponding to said predetermined direction in synchronization therewith, thereby transferring the pattern image on said mask onto said substrate. Then, a distortion is given to the pattern image which is transferred from the mask onto the substrate during the scanning exposure in accordance with anisotropical component values (such as degree of parallelogram, degree of rectangle, degree of trapezoid, etc.) within the distortion of the projected image by the projection optical system. Further, in this case, it is preferable that the mask pattern should be distorted in advance so as to set off the anisotropic component values in the distortion of said projected image.

According to such scanning exposure method of the present invention, a pattern image of the mask is distorted by adjusting an angle between the scanning direction of the mask and that of the substrate, a relative scanning speed, a projection magnification, or the like, at the scanning exposure in accordance with the anisotropic component values within the distortion of the projected image by the projection optical system. For this reason, if there is an anisotropic distortion of the projected image, deterioration in the image quality of a pattern image which is finally formed on the substrate can be suppressed to the minimum. Therefore, the resolution of the image finally formed on the substrate is not lowered. Further, in the distortion of the projected image, the anisotropic components which can be adjusted and controlled at the scanning exposure are not necessarily adjusted exactly to predetermined allowable values at the time of assembling and regulating of the projection optical system, but may be roughly adjusted, which brings about an advantage that the manufacturing time of the projection optical system and, in its turn, that of the exposure apparatus can be reduced.

If there is no distortion in a pattern on the mask, an anisotropic distortion remains in an image which is formed on the substrate in accordance with a distortion of a projected image by the projection optical system. Thus, in order to remove this remaining distortion, the pattern on the mask is distorted in such a manner that it should set off the distortion of the projected image in advance. In other words, it is possible to obtain a pattern image without distortion after the scanning exposure by reversely correcting the pattern on the mask for the distortion of the projected image, thereby improving the overlay accuracy between adjacent layers.

A scanning exposure apparatus of the present invention is provided with a projection optical system for projecting a pattern image on a mask onto a photosensitive substrate, a mask stage for scanning the mask in a predetermined direction crossing the optical axis of said projection optical system, and a substrate stage for scanning the substrate in a direction crossing the optical axis of the projection optical system and corresponding to said predetermined direction, wherein the pattern image on the mask is transferred onto the substrate by synchronously scanning the mask and the substrate with respect to the projection optical system. The apparatus is further provided with a memory for storing anisotropic component values within a distortion of a projected image by the projection optical system, and a distortion control device for distorting the pattern image which is transferred onto the substrate at the scanning exposure in compliance with the anisotropic component values of the image distortion stored in said memory.

The distortion control device is, for example, an angle controller for varying a relative angle between a scanning direction of the mask by the mask stage and a scanning direction of the substrate by the substrate stage, or a speed controller for adjusting a relative speed between a scanning speed of the mask by the mask stage and a scanning speed of the substrate by the substrate stage, or a magnification controller for adjusting a projection magnification of the projection optical system. Further, the distortion control device may be constituted by combining any two out of the angle controller, the speed controller, and the magnification controller, or by combining all (three) of the controllers. It is preferable that an exposure amount distribution control device should be also provided for controlling distribution of an exposure amount on the substrate in accordance with an adjusted amount of the pattern image on the mask by the distortion control device.

According to the scanning exposure apparatus of the present invention, even if there is an anisotropic distortion in the projected image, deterioration in the quality of an image which is formed on the substrate can be finally suppressed to the minimum. Thus, the resolution of the pattern image is not damaged. Further, since the anisotropic components are not necessarily adjusted exactly to predetermined allowable values at the time of assembling and regulating of the projection optical system, but may be roughly adjusted, the manufacturing time of the projection optical system (exposure apparatus) can be reduced. By distorting the mask pattern in such a manner that a distortion of the projected image should be set off in advance, it is possible to obtain a pattern image without distortion after the scanning exposure, thereby improving the overlay accuracy between adjacent layers.

If the distortion control device is an angle controller which changes a relative angle between the scanning direction of the mask by the mask stage and the scanning direction of the substrate by the substrate stage, a distortion, for example, in the form of a parallelogram can be corrected. If the distortion control device is a speed controller which adjusts a relative speed between the scanning speed of the mask by the mask stage and the scanning speed of the substrate by the substrate stage, a distortion, for example, in a rectangular shape can be corrected. If the distortion control device is a magnification controller which adjusts a projection magnification of the projection optical system, a distortion, for example, in a trapezoidal shape which is symmetrical with respect to the axis parallel to the scanning direction can be corrected. Further, a trapezoidal distortion which is symmetrical in the non-scanning direction can be also corrected by combining the angle controller and the magnification controller and by adjusting a relative angle and a projection magnification during the scanning exposure.

When there is provided an exposure amount distribution control device for controlling an amount of exposure on the substrate or the distribution thereof in accordance with an amount of adjustment of a pattern image on the mask by the distortion control device, even if a distortion of the image on the substrate is corrected by the distortion control device, no unevenness occurs in the amount of exposure on the substrate, or an amount of exposure exceeding or less than a predetermined range is not given, that is, an amount of exposure on the entire region on which a pattern image can be formed on the substrate can be made substantially uniform and the amount of exposure can be maintained at a proper value.

BRIEF DESCRIPTION OF THE DRAWINGS

FIG. 6 is an enlarged plan view to show a state of magnification change of shot area on an exposure surface of wafer W in FIG. 1;

DESCRIPTION OF THE PREFERRED EMBODIMENTS

An embodiment of the present invention will be described with reference to the drawings. The present embodiment is one in which the present invention is applied to a projection exposure apparatus of the slit scan exposure method having an exposure light source of pulse oscillation type such as an excimer laser beam source, as a light source.

Figure 1:
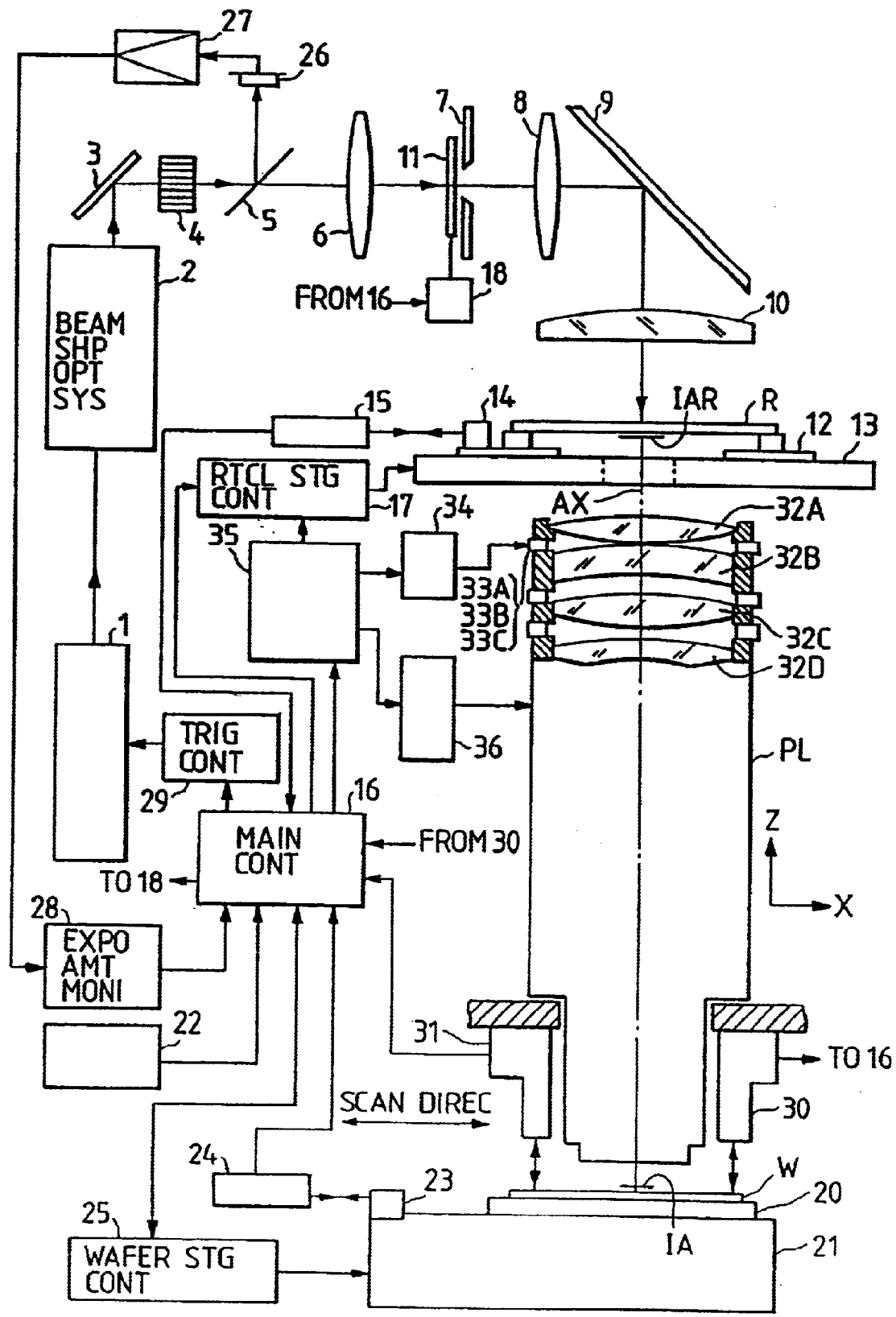
FIG. 1 is a structural drawing to show the scheme of a projection exposure apparatus of the slit scan exposure method in an embodiment of the present invention.

FIG. 1 shows the scheme of the projection exposure apparatus in this embodiment. In FIG. 1, a laser beam emitted from a light source 1 of pulse oscillation type such as an excimer laser light source is shaped in cross section of beam by a beam shaping optical system 2 composed for example of a cylinder lens and a beam expander such that it can be incident with high efficiency into a subsequent fly's eye lens 4. The laser beam emerging from the beam shaping optical system 2 enters the fly's eye lens 4 via a mirror 3.

The laser beam emerging from the fly's eye lens 4 then enters a beam splitter 5 with small reflectivity but large transmittance, and the laser beam passing through the beam splitter 5 is let to pass through a first relay lens 6 to illuminate a field stop 7 with uniform illuminance.

Also, a variable ND filter 11 is arranged as closely fit to the field stop 7 on the first relay lens 6 side of the field stop 7. The variable ND filter 11 is constructed for example of a dual blind structure, a liquid crystal display panel, an electrochromic device, or an ND filter of desired shape, which can nearly continuously change the transmittance of laser beam to make intentionally nonuniform the illuminance distribution in an illumination area IAR on a reticle R. The entire variable ND filter 11 usually has the transmittance of 100%, so that the illumination distribution is uniform in the illumination area IAR on the reticle R. A control unit 18 controls the transmittance or the like of the variable ND filter 11. The field stop 7 is so arranged that a plurality of movable light shielding portions (for example two L-shaped movable light-shielding plates) are moved for example by a motor to adjust a size of aperture (slit width). Adjusting the size of aperture, the illumination area IAR illuminating the reticle R can be set in arbitrary shape and size.

The laser beam passing through the field stop 7 is let to pass through a second relay lens 8, via a bending mirror 9 and through a main condenser lens 10 to illuminate the reticle R on a reticle stage 12 with uniform illuminance. The field stop 7 is conjugate with a pattern-formed plane of reticle R, so that the laser beam is irradiated onto the rectangular (slit) illumination area IAR on the reticle as conjugate with the aperture of field stop 7. The laser beam passing through the reticle R then enters a bitelecentric projection optical system PL, for example. The projection optical system PL forms a projection image, which is a demagnified image of the circuit pattern of reticle R, for example at a demagnification ratio of 1/4 or 1/5, on a projection area IA on a wafer W.

The reticle R is drawn onto the reticle stage 12 by vacuum suction. The reticle stage 12 is supported on a reticle support table 13 so that it can move in the direction (in the X direction) perpendicular to the optical axis AX of projection optical system PL. Also, a moving mirror 14 is fixed on an end area of reticle stage 12 in the X direction. The position of reticle stage 12 in the scanning direction is always detected at a resolution for example of about 0.01 μm by a laser interferometer 15. The information on the position of reticle stage 12 measured by the laser interferometer 15 is supplied to a main control system 16 controlling the operation of the entire apparatus, and the main control system 16 controls an X-directional motion of the reticle stage 12 through a reticle stage control unit 17.

The wafer W is drawn onto a wafer holder 20 by vacuum suction. The wafer holder 20 is held on a wafer stage 21. The wafer stage 21 is movable in the X direction, which is the scanning direction, and in the Y direction perpendicular to the X direction. The wafer holder 20 is so-arranged that it can be inclined in an arbitrary direction relative to the best focus plane of the projection optical system PL and finely be moved in the direction of optical axis AX (in the Z direction) by an unrepresented drive unit. Also, the wafer W can be rotated in the XY plane. A wafer stage control unit 25 drives the wafer stage 21 in the XY directions. A moving mirror 23 for reflecting a laser beam from a laser interferometer 24 is fixed on an end portion of wafer stage 21, whereby the position of wafer stage 21 in the XY plane is always detected for example at a resolution of about 0.01 μm by the interferometer 24. The position information (or speed information) of the wafer stage 21 is supplied to the main control system 16, and the main control system 16 controls a motion of wafer stage 21 in the X direction and in the Y direction through the wafer stage control unit 25.

Figure 2:
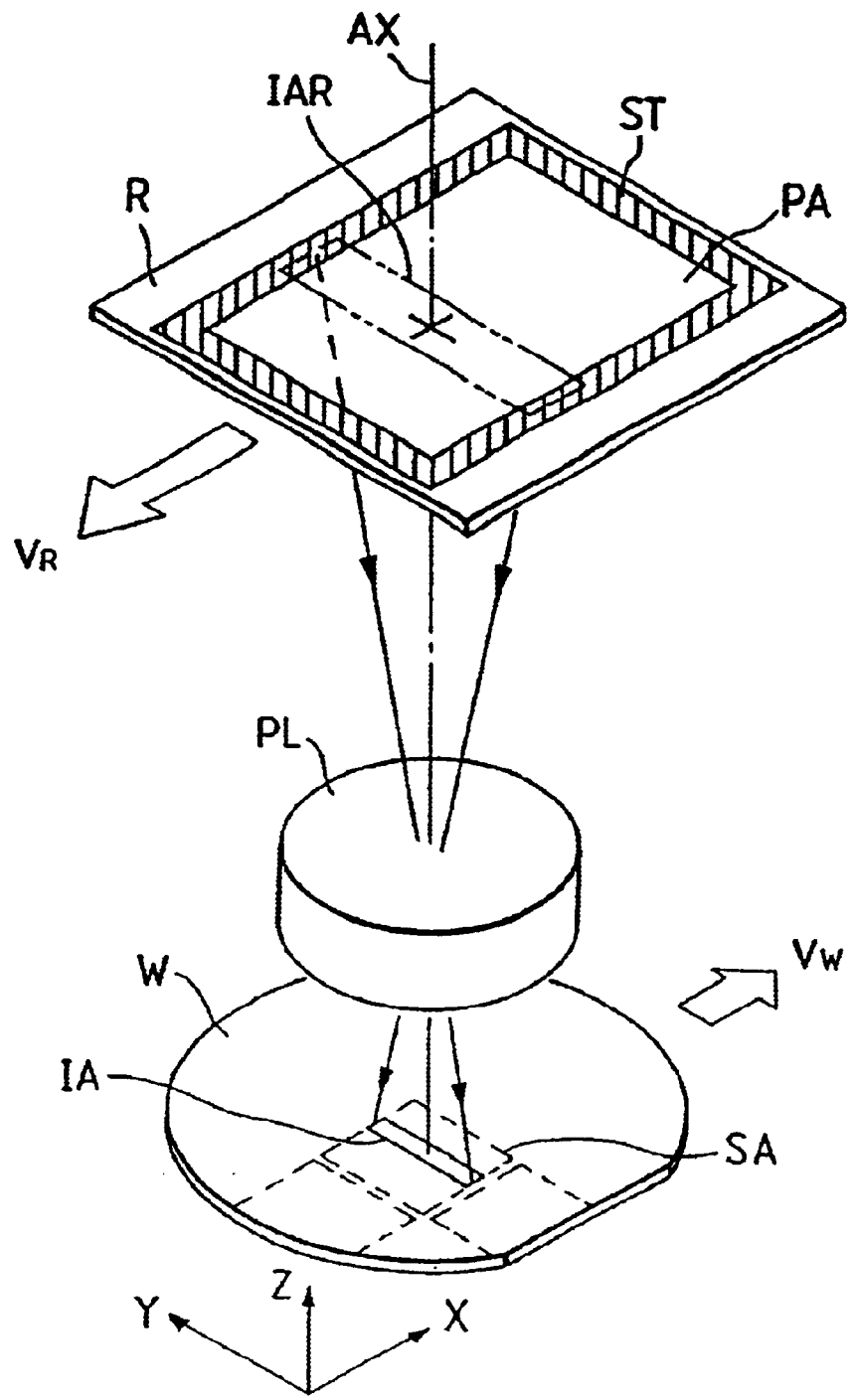
FIG. 2 is a perspective view to show a scan state of reticle R and wafer W in the projection exposure apparatus of FIG. 1.

In the projection exposure apparatus of the present embodiment, the reticle R is illuminated in the slit illumination area IAR with the longitudinal direction extending in the direction perpendicular to the scanning direction of reticle R (the X direction) as shown in FIG. 2, and the reticle R is moved at speed $V_R$ in the −X direction upon exposure. Since the wafer W is in the inverted imaging relation with the reticle R, the wafer W is moved at speed $V_W$ in synchronism with the reticle R in the opposite direction (in the +X direction) to the scanning direction of reticle R. A ratio of scanning speeds $V_W/V_R$ is accurately equivalent to a demagnification ratio of the projection optical system PL, so that a pattern in the pattern area PA on the reticle R is accurately demagnification-transferred onto a shot area SA on the wafer W. Namely, $V_W/V_R=\beta_0$ where $\beta_0$ is a projection magnification of projection optical system PL. Also, the longitudinal width of the illumination area IAR is arranged wider than the pattern area PA on the reticle R but narrower than the maximum width of light shielding area ST. The entire pattern area PA is illuminated by scanning the reticle R.

The description returns again to FIG. 1. The laser beam reflected by the beam splitter 5 is received by a light receiving element 26. A detection signal from the light receiving element 26 is supplied through an amplifier 27 to an exposure monitor 28. The exposure monitor 28 integrates signals from the amplifier 27 to supply a result of the integration to the main control system 16. A correspondence relation is preliminarily obtained between a detection signal by the light receiving element 26 and exposure energy on the exposure surface of wafer W. The main control system 16 can attain an integrated exposure amount on the exposure surface of wafer W from the signal from the exposure monitor 28. The main control system 16 controls the oscillation timing and oscillation frequency of light source 1 through a trigger control unit 29 and controls a quantity of light of each pulse beam emitted from the light source 1 through an unrepresented power control unit.

Although omitted to illustrate, a focus sensor for detecting a height of wafer W in the Z direction (focus position) is provided on the side surface of projection optical system PL. The details of the focus sensor including the structure thereof are disclosed for example in U.S. Pat. No. 4,650,983. The main control system 16 drives the wafer holder 20 in the Z direction through the wafer stage control unit 25 in accordance with a measurement result of the focus sensor to set the height of exposure surface of wafer W at the best focus position.

Further, there are alignment systems of the off-axis image processing method (hereinafter referred to as "FIA system") 30 and 31 arranged before and after the projection optical system PL in the scanning direction. The FIA systems 30 and 31 each read coordinates of alignment marks (wafer marks) formed on the wafer W in a stage coordinate system (which is a coordinate system defined based on coordinates measured by the laser interferometer 24) and supply the thus read coordinates to the main control system 16. The main control system 16 statistically processes the measured coordinates of wafer marks to obtain arrangement coordinates of shot areas in the wafer W in the stage coordinate system and to position the shot areas based on the arrangement coordinates. This method is called as Enhanced Global Alignment (EGA), which is disclosed for example in U.S. Pat. No. 4,780,617. In the EGA method the method of least squares is employed to determine six parameters in a model function matching the regularity of shot arrangement and coordinate values of each shot area are calculated based on the thus determined parameters and designed coordinate values. Also obtained on this occasion are scaling rates (scaling parameters) in the scanning direction (the X direction) and in the non-scanning direction (the Y direction) of chip pattern already formed in each shot area. This is described in detail in U.S. Ser. No. 172,099 filed on Dec. 23, 1993. The main control system 16 selects X-directional and Y-directional scaling parameters out of the six parameters determined by the method of least squares in the EGA method. The main control system 16 also detects a state of distortion of each chip pattern from the measurement result of wafer marks. The present embodiment is so arranged that according to the thus measured magnification change and distortion state of chip pattern, the relative speed between the wafer W and the reticle R is controlled as described later and the imaging properties of projection optical system PL are corrected. Then a pattern of reticle R is accurately overlaid on a previously exposed and developed chip pattern and is exposed thereon.

The main control system 16 also calculates a relative angle between the arrangement direction of each shot area and the scanning direction (the X direction) of reticle R. Then it outputs an instruction signal to the wafer stage control unit based on the information on the relative angle to control the relative angle of the scanning direction of wafer W relative to the scanning direction of reticle R.

Next described is a correction mechanism for correcting the image properties of projection optical system PL. As shown in FIG. 1, correction of imaging properties is effected in the present embodiment by driving the reticle R or a lens element in the projection optical system PL by an imaging properties control unit 35. The projection optical system PL is composed of lenses 32A, 32B, 32C, 32D, . . . arranged in the named order from the reticle R side and there are three actuators 33A, 33B, 33C each of a piezoelectric device between the lens 32A closest to the reticle R and the next lens 32B. A drive unit 34 individually sets the thickness of actuator 33A, 33B, 33C by an instruction from the imaging properties control unit 35. This adjusts a gap or an inclination between the lens 32A and the lens 32B whereby the imaging properties (magnification error, distortion, etc.) of the projection optical system PL are adjusted within a certain range. There are also actuators arranged between the lenses 32B and 32C and between the lenses 32C and 32D in the same manner as above, so that desired imaging properties can be attained by driving these lenses. It is assumed in the present embodiment for convenience' sake that the imaging properties of projection optical system PL are adjusted by driving only the lens 32A.

Also, a pressure control unit 36 is connected to the projection optical system PL. The pressure control unit 36 adjusts the pressure of gas in a lens chamber between selected lenses in the projection optical system PL, based on an instruction from the imaging properties control unit 35. The magnification error of projection optical system PL can also be adjusted by thus adjusting the pressure of gas in a selected lens chamber. It is also possible that the magnification error of projection optical system PL can be adjusted by adjusting the temperature of gas in a selected lens chamber. It should be noted that the optical axis AX of projection optical system PL means the optical axis of the main body of projection optical system PL below the lens 32D.

Figure 3A:
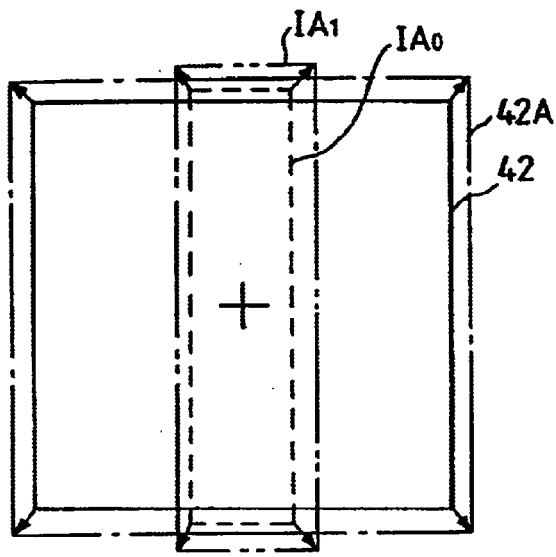
FIG. 3A is a drawing to show a change of projected image when a lens 32A is moved in the direction of optical axis in FIG. 1.

In case the lens 32A moves in parallel in the direction of optical axis AX, the projection magnification (enlargement or reduction ratio of the size of projected image) changes at a change rate according to a distance of the movement. This state is shown in FIG. 3A. In FIG. 3A, a square projected image 42 is an image of square pattern without distortion as projected by the projection optical system PL. If in this case the lens 32A is moved for example upward, the projection magnification increases so as to move the corners of projected image 42 in the directions of arrows. Then the image of square pattern is isotropically enlarged as projected as a projected image 42A. Similarly, a slit exposure area $IA_0$ without distortion is also isotropically enlarged as projected as an exposure area $IA_1$.

Figure 3B:
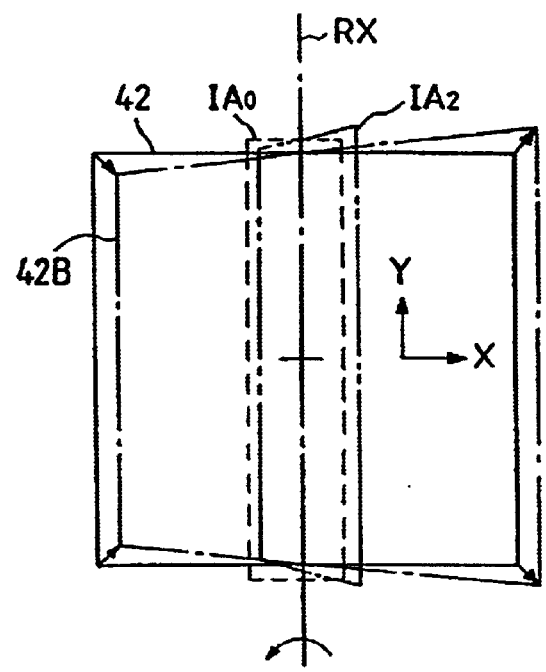
FIG. 3B is a drawing to show a change of projected image when the lens 32A is inclined relative to a plane normal to the optical axis in FIG. 1.

FIG. 3B shows a case in which the lens 32A is inclined relative to a plane perpendicular to the optical axis AX. Letting RX be a rotation axis for inclination, the corners of the square projected image 42 are extended or contracted in the directions of arrows as shown in FIG. 3B, whereby the image is projected as a trapezoidal projection image 42B as a whole. Similarly, the exposure area $IA_0$ also becomes trapezoidal as an exposure area $IA_2$. Although FIG. 3B showed an example in which the rotation axis RX is taken in the direction (y direction) perpendicular to the scanning direction (x direction), the rotation axis RX can be taken in any direction while attaining such a change in shape that the magnification decreases on the one side of the rotation axis but increases on the other side in the same manner as in the example of FIG. 3B.

Figure 3C:
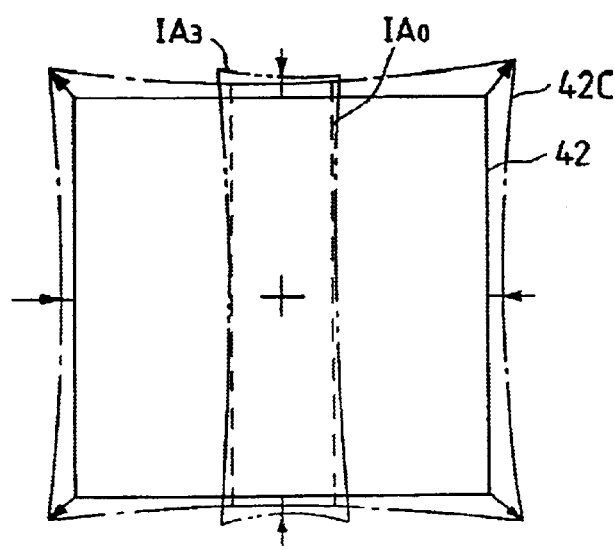
FIG. 3C is a drawing to show a change of projected image when the reticle R is driven in the direction of optical axis in FIG. 1.

Next described is a case in which the reticle R is driven. The reticle R is mounted on the reticle stage 12 as described previously. The reticle stage 12 has an unrepresented drive mechanism for driving the reticle R in the direction of optical axis AX (in the Z direction). Accordingly, this drive mechanism can change a clearance between the projection optical system PL and the reticle R. FIG. 3C shows a case in which the reticle R is moved in parallel along the optical axis AX. In FIG. 3C the projected image 42 which is originally square changes to become a projected image 42C similarly as in FIG. 3A and FIG. 3B. The exposure area $IA_0$ similarly changes as shown as an exposure area $IA_3$. A distortion of the projected image 42C is one as so called as a pincushion distortion. In contrast, if the reticle R is moved in the opposite direction, the corners of the projected image 42 move largely inward, giving a distortion as so called as a barrel distortion.

When the reticle R or the lens 32A is driven as described above, the focus position or the image plane changes with the drive, but the main control system 16 can calculate an amount of the change from a drive amount. Then the main control system 16 adds an offset of the thus calculated amount to the zero point reference of the aforementioned focus sensor, whereby the exposure surface of wafer W can be always controlled at the focus position. In this arrangement, even if the focus position or the image plane position of projection optical system PL is changed upon drive of reticle R or lens 32A, the focus position or the image plane position can be adjusted in accordance with the change as described above.

The method for adjusting the projection magnification in the non-scanning direction of projected image is not limited to the above method, but another method can be employed, for example a method for changing the pressure of internal air by the pressure control unit 36.

In the case of the full exposure method the square projected image 42 can be changed in an arbitrary shape to some extent by a combination of the above methods, whereby exposure printing can be made as matching a distortion of previously exposed shot area on the wafer W. In case of exposure by the slit scan exposure method, the exposure printing is conducted while the pattern in each shot area on the wafer W is passing the exposure area IA. Therefore, even if the exposure area $IA_0$ is changed into the trapezoidal exposure area $IA_2$ as shown in FIG. 3B, a finally exposed pattern cannot be trapezoidal as a whole. An obtained image becomes rather blurred, because identical patterns are exposed at different positions during exposure. The present embodiment solved this problem as follows.

Before describing the correction method, how to calculate a correction amount is first briefly described. First, let us consider a case in which an exposure apparatus for present exposure is different from that for previous pattern exposure and projection optical systems thereof have different distortions of projected image from each other. In this case, a pattern of each shot area on the wafer is distorted when seen from the present exposure apparatus. Then, characteristics of a distortion of projected image by the exposure apparatus for previous exposure are input into the main control system 16 through the input device 22 in FIG. 1. The input device 22 may be for example a magnetic disc device, a magnetic tape device, or a keyboard. The characteristics of distortion of projected image are input in the form of a formula or coefficients in a formula into the main control system 16. Preliminarily set in the main control system 16 are formulas for obtaining a distortion amount of the projection optical system PL itself and a distortion amount after correction by the imaging properties control unit 35. The main control system 16 calculates a correction amount for minimizing an error amount from the previously exposed shot, and corrects the imaging properties through the imaging properties control unit 35.

Next described is a case in which the above correction is insufficient, i.e., a case in which a temperature rise in process treatments causes a distortion on the wafer W. As described above, wafer marks for alignment are given to each shot area on the wafer W, and coordinates of each shot area can be measured using the wafer marks. By the EGA method described previously, coordinate positions are measured for about ten preliminarily selected shot areas (sample shots) per wafer, for example, and a shot arrangement of the entire wafer is obtained by the statistical processing. The calculation of shot arrangement by the EGA method permits one to know what distortion occurs on the entire wafer, which in turn permits one to presume how the shape of each shot area is distorted.

Figure 4:
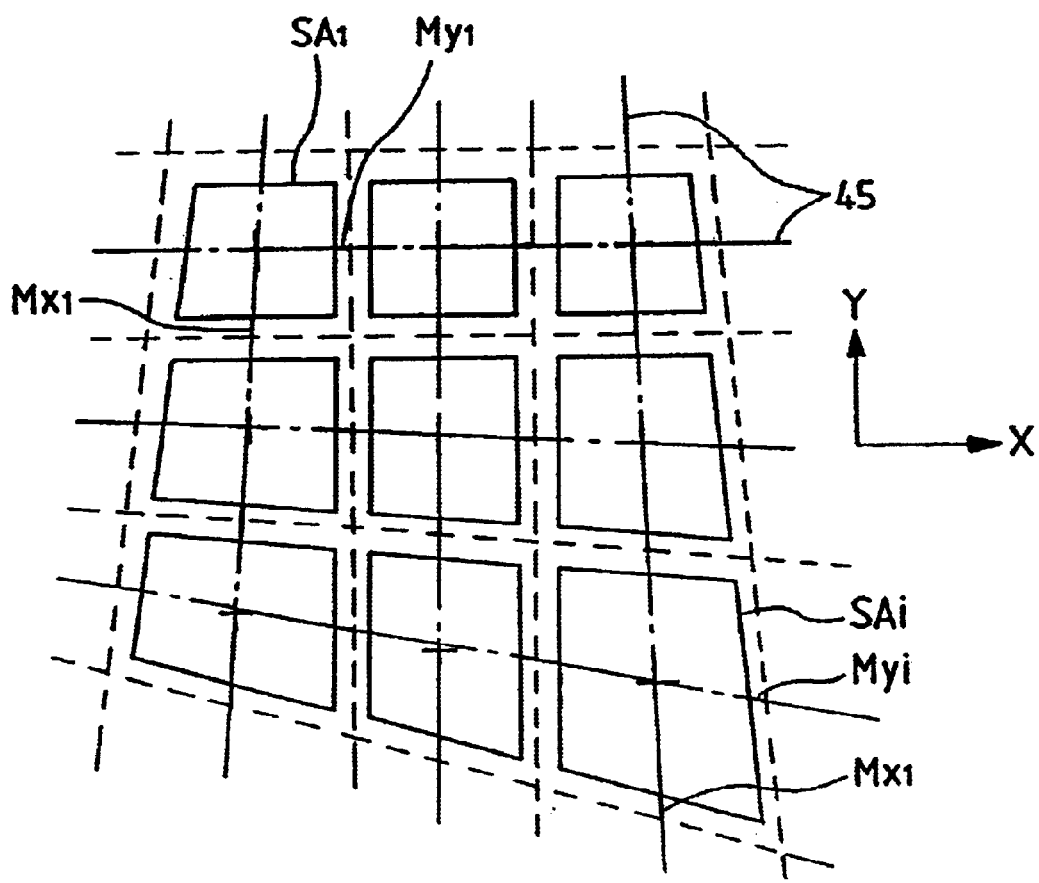
FIG. 4 is a drawing to illustrate an example of measuring method of distortion of shot arrangement due to processes of wafer.

FIG. 4 diagrammatically shows a state of distortion of shot areas on a wafer W. In FIG. 4, there are wafer marks $Mx_i$, $My_i$ for indicating x coordinate and y coordinate of the center of shot area $SA_i$, formed on street lines adjacent to the shot area $SA_i$. These wafer marks $Mx_i$, $My_i$ were simultaneously exposed when the chip patterns were exposed in the shot areas $SA_i$.

The coordinate positions of these wafer marks $Mx_i$, $My_i$ can be obtained from detection signals from the FIA systems 30, 31 in FIG. 1 and from measured values by the interferometer 24 for wafer stage. Then the main control system 16 obtains an arrangement of centers of shot areas on the entire wafer, as described previously. In the example of FIG. 4, a grid arrangement pattern 45 shown by the chain lines is obtained. How the shot areas are distorted can be known from this arrangement pattern 45. This permits one to obtain an optimum value of distortion of projected image presently exposed for each shot area $SA_i$.

Figure 5:
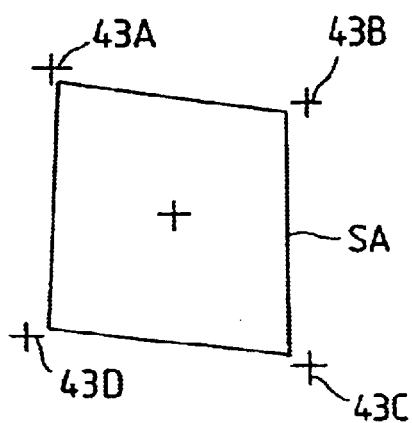
FIG. 5 is a drawing to illustrate an example of measuring method of distortion of pattern in a shot area due to processes of wafer.

Such a method may be contemplated that cross wafer marks 43A–43D are formed for example at the four corners of each shot area SA as shown in FIG. 5 and that a distortion of chip pattern formed in the each shot area SA is directly measured by measuring coordinate positions of these wafer marks 43A–43D. Using either one of the above methods, a correction amount of distortion of projected image can be obtained for each shot area on the wafer W.

Next described is an example of a method for correcting a distortion of projected image in the projection exposure apparatus of the slit scan exposure method in the present embodiment. First, let us consider a case in which only a magnification component is simply changed. Predetermined chip patterns are defined in respective shot areas on the wafer W by past processes.

FIG. 6 shows a part of exposure surface of wafer W. As shown in FIG. 6, a chip pattern is formed on each of shot areas SA1, SA2, . . . on the wafer W, and a pattern image of reticle R is projection-exposed by the slit scan exposure method as superimposed on the chip pattern.

Let $WX_1$ and $WY_1$ be actual widths of the shot areas SA1, SA2, . . . in the X direction and in the Y direction, and $WX_0$ and $WY_0$ be widths (designed widths) of shot areas SA1A, SA2A, . . . in the X direction and in the Y direction in case of the scaling factor of chip pattern being 1. Further, let $\beta_0$ be a projection magnification of designed reference of projection optical system PL, $\alpha$ be an X-directional magnification error (a change amount in scaling factor) of a chip pattern formed on the wafer W, and $\gamma$ be a Y-directional magnification error of the chip pattern. Then the following formulas hold.

$$\alpha_0+\alpha=\beta_0(WX_1/WX_0) \quad (1)$$

$$\beta_0+\gamma=\beta_0(WY_1/WY_0) \quad (2)$$

Accordingly, the magnification error $\alpha$ in the scanning direction and the magnification error $\gamma$ in the direction perpendicular to the scanning direction (in the non-scanning direction) can be expressed by the following formulas.

$$\alpha=\beta_0(WX_1/WX_0-1) \quad (3)$$

$$\gamma=\beta_0(WY_1/WY_0-1) \quad (4)$$

In the present embodiment the EGA method is applied immediately before exposure to calculate coordinate values of each shot area on the wafer W, whereby the magnification errors $\alpha$ and $\gamma$ are obtained. Then, the projection magnification $\beta_0$ of projection optical system PL is corrected by the magnification error $\gamma$ in the non-scanning direction through the imaging properties control unit 35 in FIG. 1 into ($\beta_0+\gamma$).

As shown in FIG. 6, the maximum width of exposure area IA in the Y direction is $WY_0$ with the projection magnification of projection optical system PL being $\beta_0$. When the projection magnification of projection optical system PL is set to ($\beta_0+\gamma$), the maximum width of exposure area $IA_i$ in the non-scanning direction becomes $WY_1$. When exposure is conducted while moving the wafer W in the X direction relative to the exposure area $IA_i$, an overlay error in the non-scanning direction becomes nearly 0.

In the next place, in order to correct the magnification error $\alpha$ in the scanning direction (in the X direction), a relative speed is corrected between the scanning speed of reticle R and the scanning speed of wafer W during slit scan exposure. Specifically, letting V be the scanning speed $V_R$ of reticle R in the X direction, the scanning speed $V_W$ of wafer W in the −X direction is set to ($\beta_0+\alpha$)V. Accordingly, a ratio of the scanning speeds between the reticle R and the wafer W is ($\beta_0+\alpha$).

The pattern area PA on the reticle R has the width of $WX_0/\beta_0$ in the scanning direction and is moved at speed V in the X direction. In synchronization with this, the wafer W is moved at speed ($\beta_0+\alpha$)V in the −X direction relative to the exposure area $IA_i$. Letting $\Delta X$ be the width of movement of wafer W on this occasion, the width $\Delta X$ may be obtained as follows.

$$\begin{aligned}\Delta X &= \{(WX_0/\beta_0)/V\}(\beta_0+\alpha)V \\ &= \{(\beta_0+\alpha)/\beta_0\}WX_0\end{aligned} \quad (5)$$

Substituting formula (1) into formula (5), $\Delta X=WX_1$, so that the width $\Delta X$ becomes equal to the width $WX_1$ of each shot area in FIG. 6 in the scanning direction. As described, the overlay error in the scanning direction can be made nearly equal to 0 by setting the scanning speed of wafer W in the scanning direction to ($\beta_0+\alpha$)V as in the present embodiment.

A modification may be so arranged that the above magnification errors $\alpha$ and $\gamma$ are obtained every shot area SA1, SA2, . . . in FIG. 6. Specifically, cross marks are formed at the four corners of each shot area, as previously shown in FIG. 5. X-directional and Y-directional coordinates of each mark are measured by the FIA systems 30, 31 to obtain magnification errors $\alpha$, $\gamma$ of each shot area. Upon exposure for each shot area, the magnification in the non-scanning direction and the magnification in the scanning direction are controlled through the imaging properties control unit 35 and the stage control units 17, 25, achieving magnification correction by the die-by-die method. In a further modification, a shot area is divided into a plurality of blocks and the magnification correction is effected on each block, which can also correct the distortion of the entire shot area in total.

Next described is an exposure amount control of the projection exposure apparatus. Since the light source 1 of this example is of the pulse oscillation type, the main control system 16 has the light source 1 pulse-oscillated at a selected frequency f through the trigger control unit 29 during the slit scan exposure in FIG. 1. Supposing an average light quantity of pulse beams is almost constant, an integral exposure amount varies point by point on the wafer W with a change in scanning velocity of wafer W during exposure.

Figure 7A:
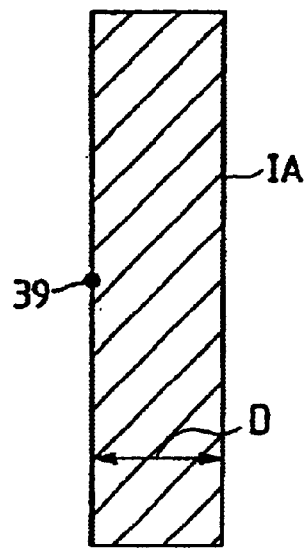
FIG. 7A is an enlarged plan view to show an exposure area on the wafer.
Figure 7B:
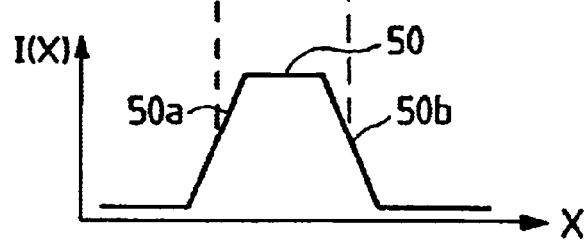
FIG. 7B is a drawing to show an illuminance distribution in a scanning direction of exposure area in FIG. 7A.

FIG. 7A shows a state near a slit exposure area IA on the wafer W, in which the width of exposure area IA in the scanning direction is defined as D. Also, a curve 50 in FIG. 7B represents an illuminance distribution I (X) in the scanning direction (X direction) for the exposure area IA upon oscillation of a pulse. X-directional ends of the illuminance distribution I (X) are relatively gently changing in a trapezoidal shape as shown by slopes 50a and 50b of the curve 50. If the illuminance distribution I (X) has such a trapezoidal shape, variations in integral exposure amount can be kept small at points on the wafer W, whereby the illumination uniformity can be improved in the scanning direction.

Here, let $\beta_0 V$ be a scanning speed of wafer W in case of no magnification error, $f_0$ be a frequency of pulse oscillation of the light source 1, and $\Delta E$ be an average value of exposure energy of one pulse. Then an integral exposure amount $\Sigma E_0$ at an exposed point 39 on the wafer W in FIG. 7A is obtained as follows. It is supposed that this integral exposure amount $\Sigma E_0$ is an aimed exposure amount.

$$\Sigma E_0 = \Delta E \cdot f_0 \cdot D / (\beta_0 \cdot V) \quad (6)$$

Next, let $(\beta_0 + \alpha)V$ be a scanning speed of wafer W in case of the magnification error in the scanning direction being $\alpha$, and $(f_0 + \Delta f_0)$ be a frequency of pulse oscillation of the light source 1. Then an integral exposure amount $\Sigma E$ at the exposed point 39 is obtained as follows.

$$\Sigma E = \Delta E \cdot (f_0 + \Delta f_0) \cdot D / \{(\beta_0 + \alpha)V\} \quad (7)$$

It is required in this case that even if the scanning speed of wafer W is changed the integral exposure amount $\Sigma E$ is kept equal to $\Sigma E_0$ of the aimed exposure amount. Thus the following formula must stand.

$$f_0 / \beta_0 = (f_0 + \Delta f_0) / (\beta_0 + \alpha) \quad (8)$$

Figure 7C:
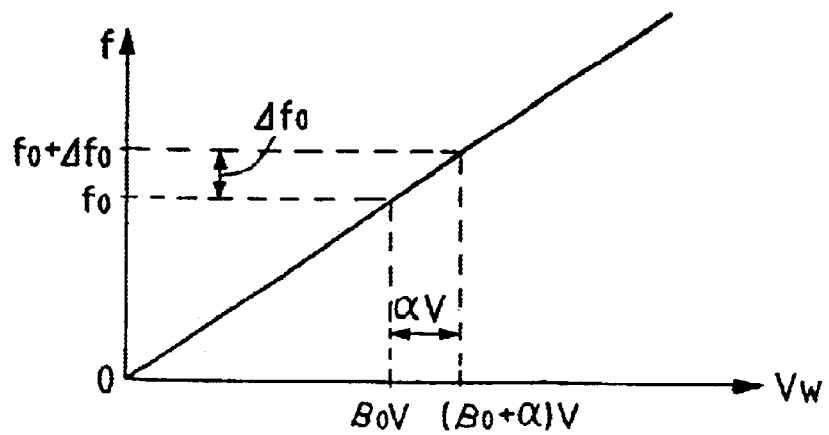
FIG. 7C is a drawing to show a relation between an oscillation frequency f of a pulse-oscillation type light source and a scanning speed $V_W$ of wafer.

This means that in order to maintain the integral exposure amount $\Sigma E$ at the aimed exposure amount, the oscillation frequency f of the light source 1 must be made proportional to the scanning speed $V_W$ of wafer W as shown in FIG. 7C. Then, during exposure by the slit scan exposure method, the main control system 16 sets the oscillation frequency f of light source 1 to a value proportional to the scanning speed of wafer W through the trigger control unit 29 while setting the scanning speeds of the reticle stage 12 and the wafer stage 21. By this, the integral exposure amount at each point on the wafer W will be kept at the aimed exposure amount even with a change in scanning speed of wafer W.

Although the above-described embodiment is so arranged that the oscillation frequency f of light source 1 is set in proportion with the scanning speed of wafer W, a modification may be so arranged that an average value of light quantity of each pulse beam is changed in proportion with the scanning speed of wafer W while the oscillation frequency of light source 1 is fixed at a constant value $f_0$. As a control method of light quantity, there are considered a method for controlling a voltage of power source for the light source 1 and a method for changing the transmittance of ND filter 11. Also, in case the light source of exposure light is not one of the pulse oscillation type but one of the continuous emission type such as a mercury lamp, a method for controlling a light quantity of exposure light in proportion with the scanning speed of wafer is used to set the integral exposure amount to the aimed exposure amount. The magnification in the scanning direction can be changed when the magnification error γ in the non-scanning direction is corrected using the imaging properties control unit 35 (at least one of the drive unit 34 and the pressure control unit 36). It is preferred in this case that the control of scanning speed of wafer W and the exposure amount control as described above are conducted taking the magnification change amount in the scanning direction into consideration.

Figure 8:
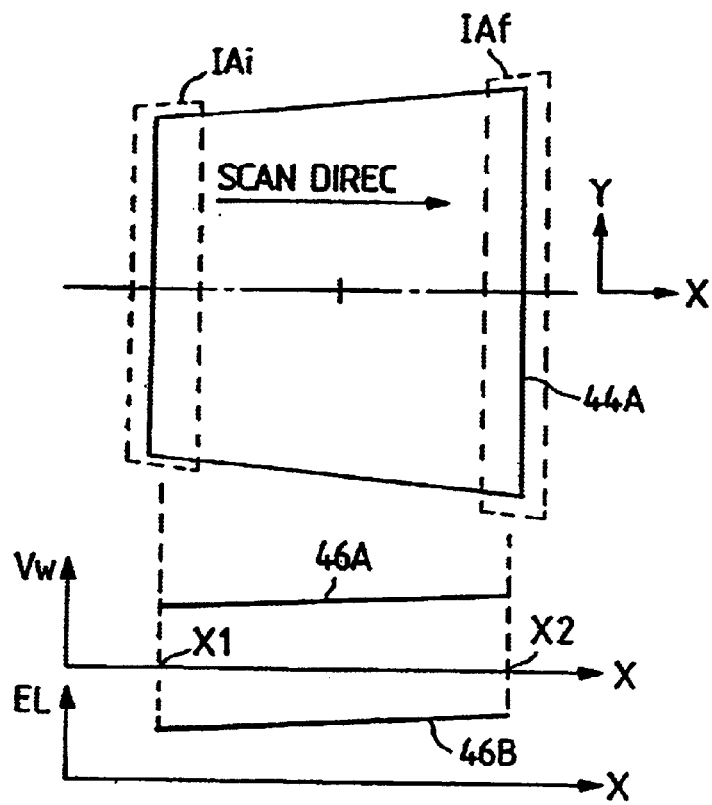
FIG. 8 is an explanatory drawing to show a method for matching a distortion of projected image with a trapezoidal distortion changing its magnification in a scanning direction.
Figure 9:
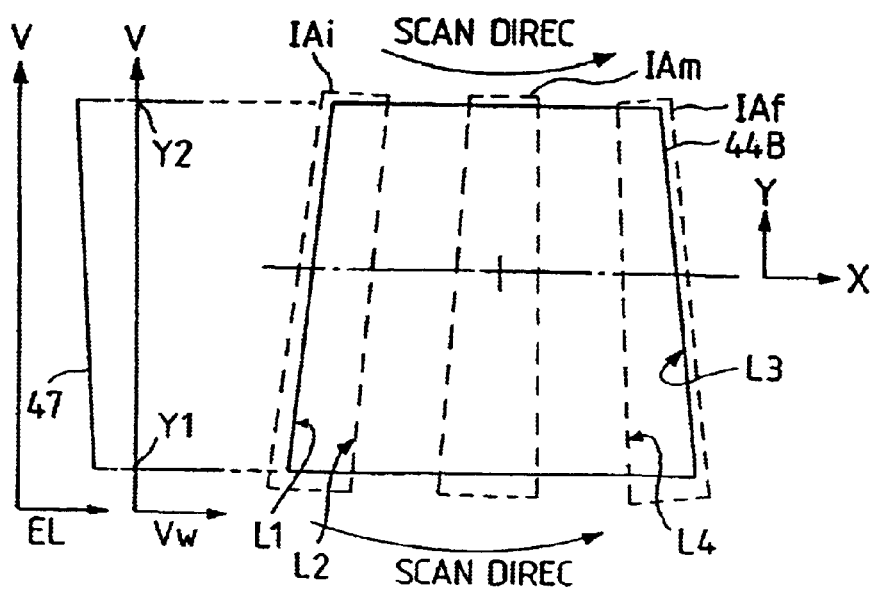
FIG. 9 is an explanatory drawing to show a method for matching a distortion of projected image with a trapezoidal distortion changing its magnification in a direction perpendicular to a scanning direction.

Next described is a correction for a trapezoidal distortion of a pattern on the wafer W. It is assumed here that the main control system 16 has preliminarily obtained how each shot area was distorted. A trapezoidal distortion can be divided into a component changing the magnification in the scanning direction as shown in FIG. 8 and a component changing the magnification in the direction perpendicular to the scanning direction as shown in FIG. 9. First described referring to FIG. 8 is a method for correcting a trapezoidal distortion with magnification changing in the scanning direction. FIG. 8 employs such an expression that a pattern 44A on a certain shot area on the wafer W is fixed but the slit exposure area moves thereon, for convenience' sake of description (the wafer W actually moves relative to the slit exposure area).

In the case of FIG. 8, the Y-directional magnification of pattern 44A increases at a constant rate depending upon the exposure position X. Therefore, correction can be effected by continuously changing the projection magnification of projection optical system PL, utilizing the previously described case in which the total magnification is isotropically changed. Specifically, the main control system 16 stores a state of Y-directional distortion of pattern 44A, for example a change amount of magnification, in correspondence with the exposure position X, and continuously changes the projection magnification of projection optical system PL, based on the change amount of magnification during scanning exposure. Also, since the slit exposure area itself has the width, the shape of slit exposure area $IA_i$ at the initial position is changed into a trapezoidal shape (see FIG. 3B). Then in FIG. 8, the slit exposure area is moved as kept in the trapezoidal shape, and the projection magnification is changed depending upon the exposure position X, performing exposure up to the exposure area $IA_f$ at the final position. This results in obtaining a trapezoidal projected image as a whole after scanning exposure.

It is possible that the projection magnification is intermittently changed instead of the continuous change of projection magnification, that is, that the projection magnification is changed by a predetermined distance every movement of wafer.

As for the magnification in the scanning direction, similarly as in the case in which the total magnification is isotropically changed, the wafer stage WST may be moved to increase the speed thereof as the magnification increases. That is, in the example of FIG. 8, the wafer stage WST is moved such that the scanning speed $V_W$ of wafer stage WST continuously increases from the position X1 to the position X2 along a straight line 46A. Also concerning the exposure amount on the wafer W, an exposure amount at each point on the wafer is kept constant after scanning exposure by controlling the light quantity per unit area (illuminance) EL in the slit exposure area to gradually increase along a straight line 46B.

Summarizing the above operations, the main control system 16 must execute the following operations during scanning exposure in accordance with measured values of the reticle-side interferometer 15: (1) up and down drive of lens 32A; (2) speed control of wafer stage 21; (3) density control of variable ND filter 11 (which can be replaced by another method as described previously).

Concerning this, for example in a case where an exposure apparatus has a correction mechanism only for the magnification component but cannot correct a distortion of trapezoidal component (for example, the lens 32A can be moved up and down in parallel with the optical axis AX but cannot be inclined), correction can be made to some extent though not perfect by using the method for changing only the magnification component as the slit exposure area $IA_i$–$IA_f$ is kept as rectangular. It is preferred in this case that exposure is conducted with as small slit width as possible, because an error becomes smaller as the width (slit width) of slit exposure area in the scanning direction decreases. This is for preventing blur of a pattern image due to a change in magnification during exposure.

Next described referring to FIG. 9 is a method for correcting a trapezoidal distortion changing the magnification in the non-scanning direction. FIG. 9 also employs the same expression as FIG. 8 in which a pattern 44B on the wafer W is fixed but the slit exposure area moves. In this case, as shown in FIG. 9, the exposure area $IA_i$ at the initial position is distorted in a trapezoidal shape with a larger magnification on the bottom side (on the lower side on the plane of FIG. 9). Then at scanning start a relative angle between the reticle R and the wafer W is changed such that a side L2 of exposure area $IA_i$ becomes parallel to a side L1 of trapezoid of previously exposed pattern 44B. Specifically, it is achieved by rotating the wafer W.

Then the relative angle is gradually changed depending upon a change in position of slit exposure area as the exposure area $IA_i$, $IA_m$, $IA_f$ by the scanning exposure as shown in FIG. 9. In more detail, the relative angle between them becomes 0 when the center of exposure area $IA_m$ comes to coincide with the center of previously formed pattern 44B, and the relative angle is then changed such that a side L4 of exposure area $IA_f$ becomes parallel to a side L3 of the trapezoidal pattern 44B at the scanning end. It is impossible in this case to perfectly overlay the projected image on the pattern 44B, different from the correction of the trapezoidal distortion as shown in FIG. 8, but the projected image after scanning exposure becomes approximately trapezoidal with the magnification changing in the non-scanning direction. Strictly speaking, the projected image is distorted like a fan in the method of the present embodiment.

Since in the above method the relative angle between the reticle R and the wafer W is changed during scanning exposure, the scanning speed $V_W$ of wafer W in a larger-magnification area (at position Y1 in FIG. 9) is faster than that in a smaller-magnification area (at position Y2 in FIG. 9), whereby the magnification is also corrected in the scanning direction. As for the exposure amount on the wafer W, a control may be made such that the illuminance EL on the lower side in FIG. 9 becomes greater as shown by a straight line 47 in FIG. 9, using the variable ND filter 11 shown in FIG. 1, because the exposure area changes in the non-scanning direction. Alternatively, the reticle R may be illuminated while changing the shape of aperture of reticle blind 7 in FIG. 1 such that the width of slit exposure area in the scanning direction is larger on the bottom side of FIG. 9.

If in the case of FIG. 9 an exposure apparatus has no mechanism for correcting the trapezoidal distortion, an imperfect method of changing only the relative angle between the reticle R and the wafer W may be employed similarly as in the case of FIG. 8.

As described above, a trapezoidal distortion component can be corrected as divided into a component changing the magnification in the scanning direction and a component changing the magnification in the non-scanning direction. As an application for a rectangular distortion, the isotropical magnification correction in the scanning direction or that in the non-scanning direction can be employed among the above-described isotropical magnification corrections, or the both can be employed with different magnification ratios.

Figure 10:
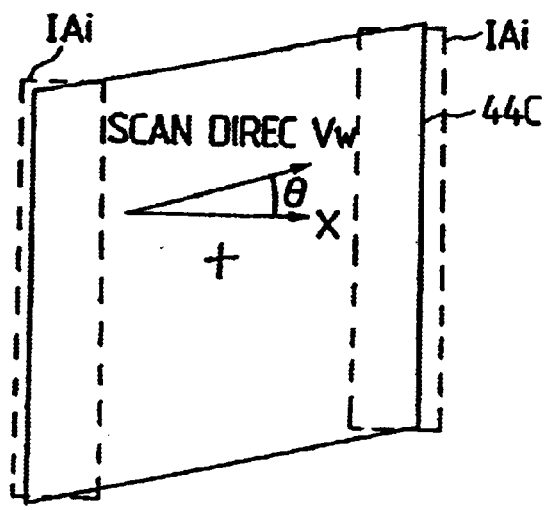
FIG. 10 is an explanatory drawing to show a method for matching a distortion of projected image with a rhombic distortion.

Also, in case a pattern 44C formed on the shot area on the wafer W is distorted in a rhombic shape as shown in FIG. 10, the shape of slit exposure area $IA_i$ does not have to be changed from the scanning start to the scanning end. The wafer W is moved at scanning speed $\beta_0 V$ in a direction intersecting at a relative angle $\theta$ with the scanning direction of reticle R (the X direction) while keeping the adjusted relative angle between the reticle R and the wafer W. This can distort the projected image in a rhombic shape approximately matching the pattern 44C.

Figure 11:
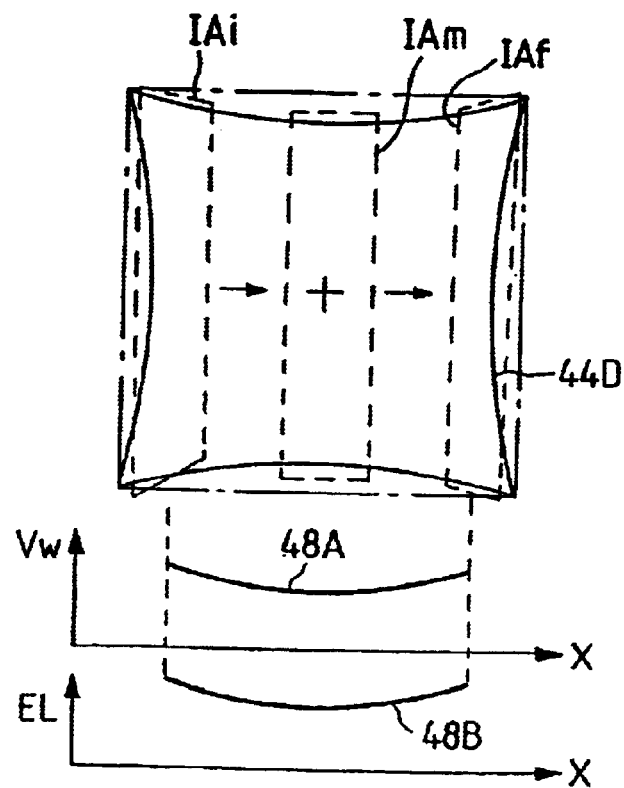
FIG. 11 is an explanatory drawing to show a method for matching a distortion of projected image with a pincushion distortion.

Further, the following method is contemplated for a case in which a pattern 44D on the wafer W has a pincushion (or barrel) distortion, as shown in FIG. 11.

Similarly as in the above correction methods, the main control system 16 stores a change amount in Y-directional magnification of pattern 44D in correspondence with the exposure position X as to the non-scanning direction and continuously changes the projection magnification of projection optical system PL based on the change amount in magnification during scanning exposure. As shown in FIG. 11, the projection magnification is decreased when the center of exposure area $IA_m$ is correspondent with the center of pattern 44D within the previously exposed shot area, while the exposure areas $IA_i$ and $IA_f$ are shaped as trapezoidal at the both ends to increase the projection magnification. Then exposure is conducted while continuously changing the exposure area in the order of $IA_i$, $IA_m$ and $IA_f$. For the scanning direction, the scanning speed $V_W$ of wafer W is arranged as smaller at the center and to increase to the both ends as shown by a curve 48A. Also, the exposure amount is so arranged that the illuminance distribution EL is higher at the both ends but lower at the center as shown by a curve 48B.

Also, the above-described method can be combined with the vertical motion of reticle R to produce a pincushion distortion on a scanned image itself whereby the correction accuracy is enhanced.

More complicated distortions of a pattern formed on wafer can be dealt with by arbitrary combinations of the correction methods as described in the above embodiment.

The above embodiment handled the example in which a state of distortion of projected image of presently exposed reticle R is adjusted to match a distortion of pattern in a previously exposed shot area. It is, however, contemplated that for example when exposure on a first layer on the wafer is effected (i.e., when exposure is conducted without need to consider the overlay), a projected image is preliminarily distorted as matching a distortion of projected image by an exposure apparatus performing exposure in a next layer. Another method may be considered, for example a method in which a distortion of wafer itself due to processes is preliminarily expected and a counter distortion is given upon exposure to cancel the distortion. Further, correction can be made in cases where the wafer W absorbs the exposure light during exposure to be expanded or where the reticle R absorbs the exposure light whereby the projected image is distorted.

It is also considered that if a transmittance distribution of pattern formed on the reticle R (pattern existence rate distribution) is greatly biased a heat distribution inside the projection optical system PL becomes asymmetric and as a result an exposed image is distorted in a trapezoidal shape for example as shown by the pattern 44B in FIG. 9. Applying the present invention to such a case, the distortion of the exposed image can be corrected. Calculations of distortion amount of projected image due to these factors are disclosed for example in Japanese Laid-open Patent Application No. 2-297918 for the exposure apparatus of the full exposure method. It discloses that a distortion of projected image is obtained by calculation of heat conduction and that a distortion of projected image is measured by measuring a spatial image. Also, the method for optimizing a distortion of projected image during screen synthesis (screen connection) is also disclosed in Japanese Laid-open Patent Application No. 5-62878, to which the present invention can be applied.

Also, although the present embodiment employs the FIA system as the alignment system, another method may be employed such as the through-the-lens (TTL) method in which the marks on wafer W are detected through the projection optical system PL, or the through-the-reticle (TTR) method in which the marks on wafer W are detected through the reticle R and the projection optical system PL.

Figure 12:
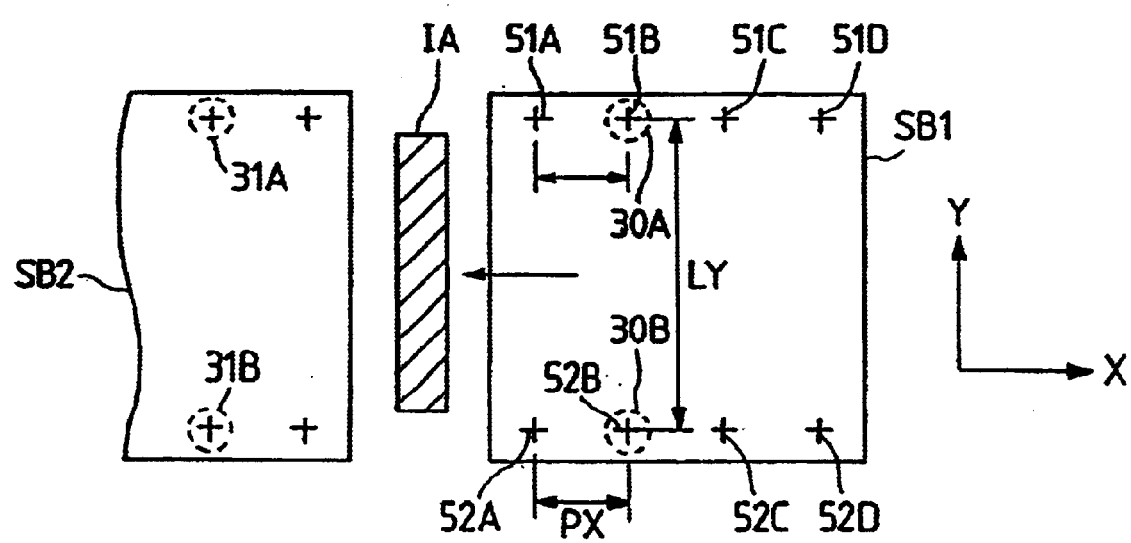
FIG. 12 is an enlarged plan view to show shot areas on a wafer in another embodiment of the present invention.

A modification of the present invention is next described referring to FIG. 12. The present modification employs the projection exposure apparatus of FIG. 1 as it is but the operation thereof is different in exposure.

FIG. 12 shows a wafer to be exposed in this example. In FIG. 12, a chip pattern is already formed in each shot area SB1, SB2. Also, there are two rows of wafer marks 51A–51D and 52A–52D formed in the X direction in the shot area SB1. Similar wafer marks are formed in other shot areas. For example, when a pattern image of reticle is exposed in the shot area SB1, the wafer is moved in the −X direction relative to the slit exposure area IA. The slit exposure area IA is the same as the exposure area IA on the wafer W as shown in FIG. 1.

Also, observation areas of the FIA system 30 as the off-axis alignment system in FIG. 1 are two observation areas 30A and 30B in FIG. 12, while observation areas of the FIA system 31 in FIG. 1 are two observation areas 31A and 31B in FIG. 12. Namely, the observation areas 30A and 30B are located on the scanning start side relative to the exposure area IA while the observation areas 31A and 31B on the scanning end side relative to the exposure area IA. Moving the shot area SB1 relative to the exposure area IA, the wafer marks 51A–51D and 52A–52D pass the observation areas 30A and 30B, respectively. Then, the FIA system 30 in FIG. 1 successively measures a Y-directional distance LY between the wafer marks 51A and 52A, between the wafer marks 51B and 52B, . . . Further, the FIA system 30 successively measures an X-directional distance PX between the wafer marks 51A and 51B, between the wafer marks 52A and 52B, . . . . These measurement results are supplied to the main control system 16.

The main control system 16 successively calculates X-directional and Y-directional magnification changes at each portion in the shot area SB1 from the measurement results of distances LY, PX. Then, when exposure is effected while moving the shot area SB1 in the −X direction relative to the exposure area IA, magnification changes of a next exposed portion are calculated by pre-reading X-directional and Y-directional distances of wafer marks, and exposure in the shot area SB1 is conducted while correcting the X-directional and the Y-directional magnification changes. Also in this example, the X-directional magnification change is corrected by correcting the scanning speed of wafer and the Y-directional magnification change is corrected by correcting the projection magnification of the projection optical system PL.

When the wafer is moved in the X direction relative to the exposure area IA, coordinates of wafer marks are pre-read using the FIA system 31 in FIG. 1. According to this example as described, coordinates of wafer marks are pre-read upon exposure and exposure can be made while correcting the magnification errors in the scanning direction and in the non-scanning direction, based on the pre-read results, which can omit preliminary measurements of scaling factor or distortion state of each shot area on wafer, reducing an exposure time. Also, the magnification change can be corrected for individual segmental blocks in each shot area SB1, . . . , so that a distortion of each shot area can be corrected.

Although the embodiment in FIG. 1 is so arranged that coordinate positions of wafer marks on the wafer W are preliminarily measured and the measurement results are statistically processed to obtain magnification changes of each shot area, the statistical processing method may be combined with the method for measuring and correcting the magnification changes by the die-by-die method in the present modification. Namely, magnification changes of the entire wafer and a change in distortion are preliminarily obtained by the statistical processing. Then the imaging properties of projection optical system PL are corrected before exposure in each shot area. Then the scanning exposure is done while adjusting the relative speed between the wafer W and the reticle R as described previously in the embodiment. On this occasion, the measurements of magnification change and distortion are again conducted by the die-by-die method for each shot area. Then obtaining remaining magnification errors and remaining distortion, the imaging properties of projection optical system PL and the relative scanning speed between the wafer W and the reticle R are again corrected upon exposure. This method can improve the throughput in the case where the magnification and distortion greatly change shot area by shot area.

For a change in magnification of projection optical system PL due to irradiation energy upon exposure, a relation is preliminarily obtained between the irradiation energy and the magnification change of projection optical system PL. Then the magnification of projection optical system PL can be well corrected through the imaging properties control unit 35 so as to cancel the magnification change of projection optical system PL, based on an integral exposure amount detected by the exposure amount monitor 28.

Figure 13:
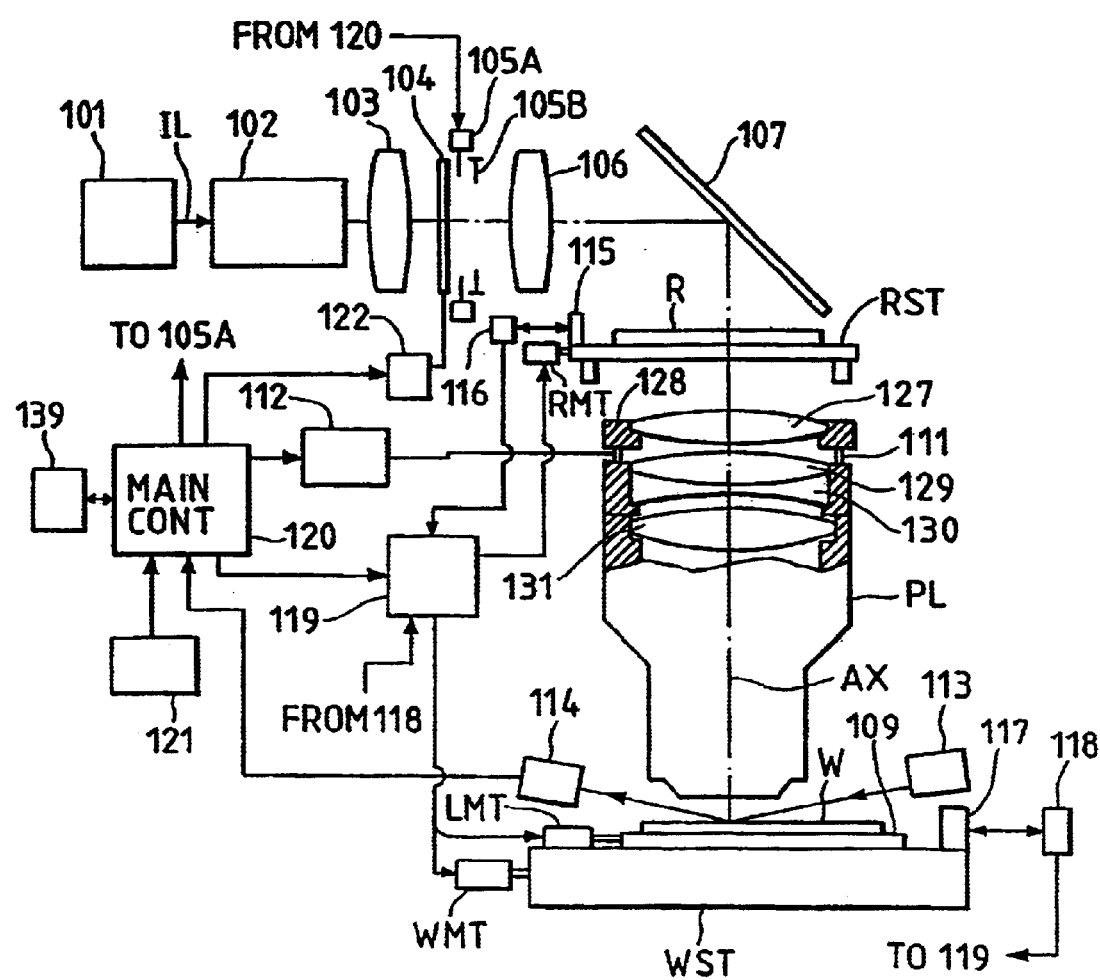
FIG. 13 is a drawing to show a schematic structure of the projection exposure apparatus of the step and scan method in a second embodiment of the present invention.

Next, another embodiment of the present invention will be described with reference to FIG. 13. FIG. 13 shows a schematic structure of the projection exposure apparatus of the step and scan method of the present embodiment.

Referring to FIG. 13, an illumination light IL emitted from a light source 101 is, after passing through an unrepresented shutter, converted into light beam having a substantially uniform illumination distribution by an illumination intensity unification optical system 102 which consists of a collimator lens, a fly's eye lens, and the like. As the illumination light IL, excimer laser light from a KrF excimer laser, an ArF excimer laser, or the like, harmonics from a copper steam laser or a YAG laser, or bright lines (g line, i line, etc.) within an ultraviolet range from an ultra high-pressure mercury-arc lamp are used.

The illumination light emitted from the illumination intensity unification optical system 102 reaches a reticle blind 105A of a movable type and a reticle blind 105B of a fixed type via a relay lens 103. An arrangement of the reticle blinds 105A and 105B is disclosed in the U.S. patent application Ser. No. 255,997 (Jun. 8, 1994) by the present applicant, and will be described here in brief.

The reticle blind 105A is arranged on a plane substantially conjugate with an exposure plane (for example, the surface) of the wafer W, and consists of a plurality of movable light-shielding portions (for example, four rectangular movable light-shielding plates or two L-shaped movable light-shielding plates).

Then, at least one movable light-shielding portion is driven by, for example, a motor in synchronization with motions of the reticle and the wafer immediately before and after a start and an end of the scanning exposure, respectively, whereby the width of a light-shielding band on the reticle can be reduced. A function and an operation of the reticle blind 105A is disclosed in U.S. patent application Ser. No. 068,101 (May 28, 1993) and Ser. No. 255,997 (Jun. 8, 1994) by the present application.

The reticle blind 105B is arranged to be away from the plane conjugate with the pattern-forming plane of the reticle R by a predetermined distance in the direction of the optical axis, and has an opening in a rectangular shape for specifying an illumination area on the reticle R. In the present embodiment, the reticle blind 105B is disposed one the reticle side with respect to the reticle blind 105A. The width of the illumination area on the reticle R in the scanning direction is specified by the reticle blind 105B, and the width in the non-scanning direction which is perpendicular to the scanning direction is specified by the reticle blind 105A. Note that the width of said illumination area in the scanning direction is limited by the reticle blind 105A immediately before and after a start and an end of the scanning exposure, as stated before.

On the side of the relay lens 103 of the reticle blind 105A, a variable ND filter 104 which is capable of setting a transmittance distribution into a desirable state is disposed in the vicinity. The variable ND filter 104 is constituted by, for example, a double blind structure, a liquid crystal device, an electrochromic device, or an ND filter in a desired shape. A variable ND filter control unit 122 can make the illumination distribution in the illumination area IAR on the reticle R (see FIG. 2) uneven intentionally, by controlling the variable ND filter 104 to change said transmittance gradually or continuously. In this manner, an amount of exposure caused by the scanning exposure can be made substantially uniform on the entire area on the wafer W on which a pattern image of the reticle R is to be formed.

Normally, the transmittance of the variable ND filter 104 is set to be substantially 100% on the entire surface thereof so that the illumination distribution in the illumination area IAR on the reticle R becomes uniform. The variable ND filter 104 is not necessarily disposed in the vicinity of the light source of the reticle blind 105A, but may be disposed nearer the light source than, for example, the position in FIG. 13, or may be disposed on the reticle side with respect to the reticle blind 105A. A manner of use of the variable ND filter 104 will be described later. Note that the variable ND filter control unit 122 and the reticle blind 105A are controlled by a main control system 120 which controls the entire apparatus.

The illumination light passing through the ND filter 104 and the reticle blinds 105A and 105B illuminates the reticle R on which a circuit pattern, etc., are depicted via a relay lens 106 and a dichroic mirror 107. The reticle R is vacuum-absorbed and held on a reticle stage RST which moves two-dimensionally on a plane perpendicular to the optical axis AX of the illumination optical system (projection optical system PL).

The reticle stage RST becomes movable at a specified speed along a predetermined scanning direction (x direction) by a drive system RMT which consists of a linear motor, or the like. Further, the reticle stage RST is mounted on an unrepresented base at a motion stroke which allows the entire plane of the reticle R to intersect at least the optical axis AX of the illumination optical system with respect to the scanning direction.

A moving mirror 115 for reflecting the laser beam from a laser interferometer 116 is fixed to the end of the reticle stage RST. The position of the reticle stage RST in the scanning direction is detected any time by the interferometer 116 with a resolution of, for example, 0.5 nm or around. The position information on the reticle RST output from the interferometer 116 is sent to a stage controller 119, and the stage controller 119 drives the reticle stage RST via the drive system RMT based on said position information and a command value (target position, for example) from the main control system 120. An initial position of a reticle stage RST is determined such that the reticle R is positioned on a predetermined reference position with a high accuracy by two sets of reticle alignment systems (not shown) which are arranged to be opposite to each other above the reticle R sandwiching a pattern area PA therebetween. As a result, the position of the reticle R is considered to be measured with enough accuracy only by measuring the position of the moving mirror 115 with the interferometer 116.

The illumination light IL passing through the reticle R enters, for example, a bitelecentric projection optical system PL. The projection optical system PL forms a projected image which is obtained by reducing a circuit pattern of the reticle R into 1/5 or 1/4 thereof on a wafer W having the surface coated with photoresist (photosensitive material).

In the present embodiment, like in the foregoing first embodiment (FIG. 2), at the scanning exposure, the reticle R is moved at a speed $V_R$ along the −x direction (or the +x direction) with respect to the oblong illumination area IAR which extends in the direction (y direction) perpendicular to the scanning direction thereof (x direction) and has its center corresponding to the optical axis AX. The wafer W is moved at a speed $V_W$ along the +x direction (or the −x direction) with respect to an exposure area IA which has an inverted image forming relation with the illumination area IAR on the reticle R with respect to the projection optical system PL, in synchronization with the motion of the reticle R. That is, the reticle R and the wafer W are moved in synchronization at a speed ratio ($V_W/V_R$) corresponding to a demagnification ratio of the projection optical system PL in the opposite directions to each other, whereby the entire surface of the shot area SA on the wafer W is exposed by the pattern image of the reticle R. The projection optical system PL is of the non-telecentric scheme in FIG. 2, but it is actually of the bitelecentric scheme.

The wafer W is vacuum-absorbed and held on a wafer holder 109. The wafer holder 109 is mounted on a wafer stage WST. The wafer holder 109 is arranged to be rotatable on the plane perpendicular to the optical axis while it can be inclined with respect to the image forming plane of the projection optical system PL and can be finely movable in the direction of the optical axis AX (z direction), by the drive system LMT which consists of, for example, three piezo-electric elements (or voice coil motors), etc. The wafer stage WST is arranged to be movable also in the direction (y direction) perpendicular to the scanning direction so as to effect scanning exposure not only in the above-mentioned scanning direction (x direction), but of a plurality of shot areas by using a drive system WMT which consists of a linear motor (or a feeding spring and a motor), and the like, thereby performing a step and scan operation in which an operation for a scanning exposure of each shot area on the wafer W and an operation of moving each shot area to the scanning start position are alternately repeated.

At the end of the wafer stage WST, a moving mirror 117 for reflecting laser beam interferometer 118 is fixed, and the position of the wafer WST on the xy plane is detected any time by the interferometer 118 at a resolution of, for example, 0.5 nm. The position information (or speed information) of the wafer stage WST is sent to a stage controller 119, and the stage controller 119 drives the wafer stage WST via the drive system WMT on the basis of this position information (or the speed information) and a command value (for example, on the target position) from the main control system 120.

Further, a wafer position detection system (focus sensors) of a slant incident scheme which consists of an illumination optical system 113 for supplying image forming light beam for forming a pinhole (or slit) image toward the image forming plane of the projection optical system PL from a direction inclined with respect to the optical axis AX and a light-receiving optical system 114 for photoelectrically detecting reflected light beam of said image forming light beam on the wafer W is fixed to a column (not shown) for supporting the projection optical system PL. The arrangement of the focus sensors is disclosed, for example, in the U.S. Pat. No. 4,650,983. These focus sensors are arranged to detect a positional deviation in the optical axis direction (z direction) with respect to the image forming plane on the wafer surface. Outputs from the wafer sensors are used to drive the wafer holder 109 in the z direction in such a manner that the wafer surface is arranged on the image forming plane of the projection optical system PL. Position information output from the focus sensors is sent to the stage controller 119 via the main control system 120. The stage controller 119 drives the wafer holder 109 in the z direction via the drive system SMT on the basis of this position information.

In the present embodiment, the focus sensors are calibrated in such a manner that the image forming plane becomes a zero point reference. That is, an angle of an unrepresented parallel plane glass (plane parallel) provided inside the light-receiving optical system 114 is adjusted. In FIG. 13, only the focus sensors 113 and 114 are illustrated. However, a leveling sensor disclosed in the U.S. Pat. No. 4,558,949, for example, is additionally provided for detecting an inclination of the wafer surface with respect to the image forming plane of the projection optical system PL. Or, instead that both the focus sensors of FIG. 13 and the leveling sensors are provided, a multi-point focus sensor may be provided for detecting the position of the wafer W in the z direction (that is, a positional deviation between the wafer surface and the image forming plane) at a plurality of measurement points respectively set inside and outside the exposure area IA of the projection optical system PL, as disclosed, for example, in the U.S. patent application Ser. No. 172,098 (Dec. 23, 1993) so that the positional deviation and the inclination of the wafer surface with respect to the image forming plane may be detected by this multi-point focus sensor.

Incidentally, there is provided a correction mechanism for correcting imaging properties of the projection optical system PL in the apparatus shown in FIG. 13. This correction mechanism is arranged to correct a change in the imaging properties of the projection optical system PL itself caused by a change in the atmospheric pressure, absorption of illumination light, etc. The correction mechanism will be described in the following. The imaging properties of the projection optical system PL include a focus position, a curvature of image field, a distortion, astigmatism, etc. A several types of mechanisms can be conceived for correcting these properties. However, only a mechanism related to a distortion of an projected image will be described here.

As shown in FIG. 13, in the present embodiment, a lens element 127 in the projection optical system PL is driven to the optical axis direction by an imaging properties control unit 112 so that the imaging properties are corrected. Out of a plurality of lens elements for constituting the projection optical system PL, the lens element 127 nearest the reticle R is fixed a support member 128, and lens elements 129, 130, 131, . . . other than the lens element 127 are fixed to the body of the lens barrel of the projection optical system PL. The support member 128 is connected to the body of the lens barrel of the projection optical system P1 via an actuator 111 which comprise a plurality flexible piezoelectric elements (three, for example; only two are illustrated in FIG. 13), etc.

Figure 3D:
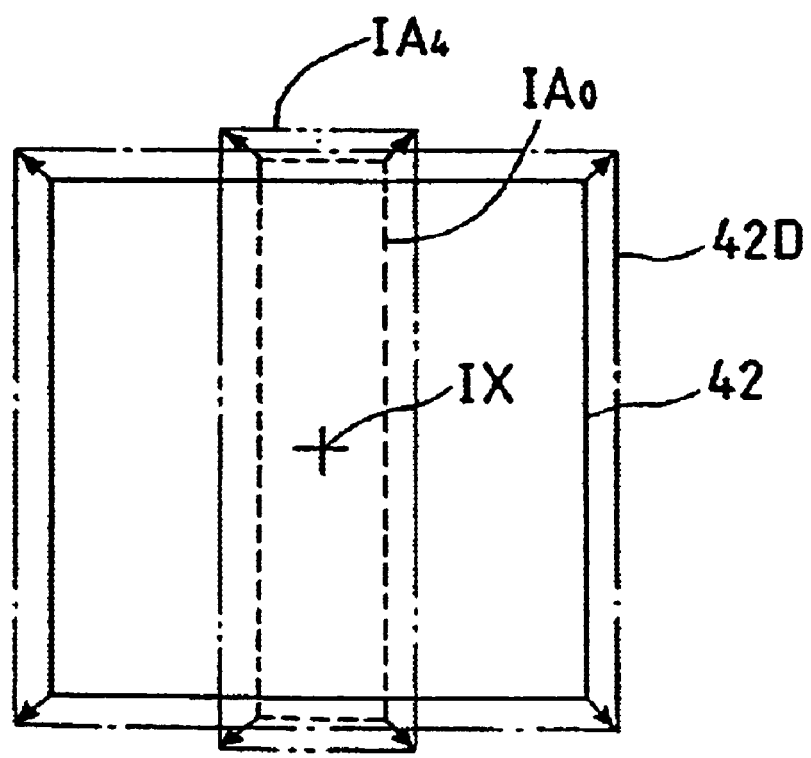
FIG. 3D is a drawing to show a change of the projected image when the lens element nearest the reticle is driven to the direction of optical axis in FIG. 13.

In this case, when the lens element 127 moves in parallel in the direction of the optical axis AX, a projection magnification varies at a ratio corresponding to an amount of the motion (ratio of expansion/reduction of dimensions of a projected image). This state is shown in FIG. 3D. A projected image 42 in the form of regular square in FIG. 3D represents a square pattern image without distortion projected by the projection optical system PL. In this case, if the lens element 127 is moved, for example, upward (to the reticle side), the projection magnification becomes larger and each apex of the projected image 42 is moved to the direction of the arrow. Thus, the square pattern image is projected as the projected image 42D enlarged isotropically. In the same manner, by the scanning exposure method, a rectangular exposure area $IA_0$ with no distortion is isotropically enlarged into an exposure area $IA_4$.

When the lens element 127 is driven in the above-mentioned manner, the focus position or the image field is changed corresponding thereto. However, an amount of such change can be calculated by the main control system 120 on the basis of an amount of each drive of the actuator 111. Therefore, the main control system 120 adds an amount obtained from said calculation to the focus sensors (113 and 114) for offsetting, by inclining, for example, the plane parallel in the light-receiving optical system 114 by said offset amount, or electrically adding said offset amount to outputs of the focus sensors. Then, the stage controller 119 drives the wafer holder 109 via the drive system LMT so as to make the exposure plane of the wafer W always coincident with the focus position. Thus, even if the focus position or the image field position of the projection optical system PL changes together with the drive of the lens element 127, the exposure plane of the wafer W can be set at the focus position to follow said change. Note that a method of correcting a distortion of a projected image is not limited to the foregoing one. There is other methods including one by which a space sandwiched between two lens elements of the projection optical system PL is sealed to change the pressure therein.

The main control system 120 is connected to an input unit 121 which comprises a magnetic disk, magnetic tape, keyboard, or the like, for inputting a command or data from the operator and a memory 139 for storing anisotropic component values in a distortion of a projected image by the projection optical system PL.

Before description of a method of control and adjustment of a distortion in a projected image at the scanning exposure in the present embodiment, a method for determining an amount of control and an amount of adjustment of a distortion of a projected image will be described.

Referring to FIG. 13, the main control system 120 can be informed of an amount of distortion of a projected image by the projection optical system PL by inputting a result of measurement conducted by, for example, an external measuring device via the input unit 21. In this case, if the coordinates of the position of a projected image without distortion are donated by (X, Y), the coordinates (X', Y') of the position of a projected image with distortion can be denoted by the following equations:

$$X' = (1+\alpha+\beta+K_1 X+K_2 Y)X - (\gamma+\theta)Y + T_X$$

$$Y' = \theta X + (1+\alpha+K_1 X+K_2 Y)Y + T_Y \qquad (9)$$

where $\alpha$ represents an isotropic error in the projection magnification; $\beta$ a rectangular distortion magnification (an error in the projection magnification in the x direction); $\gamma$ distortion in parallelism; $K_1$ and $K_2$ degrees of trapezoidal form; $\theta$ a rotation; and $T_X$, $T_Y$ entire shifts. These parameters can be obtained by the method of least squares in which actually-measured coordinates (X', Y') are substituted for the equation (9) and remaining error components relative to the coordinates (X, Y) designed to be without distortion.

Out of these parameters, the error in the projection magnification $\alpha$, the rotation $\theta$ and the shifts $T_X$, $T_Y$ do not cause deterioration in the image quality. However, if these parameters are corrected prior to the exposure, a pattern image exposed on the wafer becomes nearer to a designed one. On the other hand, the anisotropic components including the rectangular distortion $\beta$, the distortion in parallelism $\gamma$, and the degrees of trapezoidal form $K_1$ and $K_2$ cause deterioration in the image quality. As a result, it is preferable to correct the latter parameters as much as possible at the scanning exposure.

Next, a method for correcting a distortion of a projected image in the present embodiment will be described. First, when there is only a simply isotropical magnification error $\alpha$ present, prior to the scanning exposure, the lens element 127 of the projection optical system PL is driven in such a manner that a magnification error between the projected image related to the direction (y direction) perpendicular to the scanning direction and the shot area SA should be zero, thereby adjusting the projection magnification (see FIG. 3D). Then, at the scanning exposure, the reticle R and the wafer W are moved in synchronization by changing a speed ratio ($V_W/V_R$) between the scanning speed of the reticle R and that of the wafer W by the magnification error $\alpha$ from the projection magnification M of the projection optical system PL. In other words, though the reticle R and the wafer W are moved in synchronization at a speed ratio (1:M) corresponding to the projection magnification M thereof, the scanning speed $V_W$ of the wafer W is made M times the scanning speed $V_R$ of the reticle R when, for example, it is desired to increase the magnification of an image formed on the wafer W in accordance with said magnification error $\alpha$. In this manner, a magnification error between an image formed on the wafer W by the scanning exposure and the shot area SA in the scanning direction (x direction) becomes substantially zero.

Corresponding to changes in the projection magnifications and in the scanning speed ratio, an amount of exposure applied onto the wafer W by the scanning exposure varies a little relative to the target value (an appropriate exposure amount corresponding to the photosensitive characteristics of the photoresist). This amount of variation is normally in a range which can be ignored for controlling an accuracy of the exposure amount required for the exposure apparatus. However, this amount of variation can be corrected if needed. In order to correct such an amount of exposure, when the illumination light IL is continuous light (i line, or the like), there are correction methods including (1) a method by which the scanning speeds of the reticle R and the wafer W themselves (not a relative speed therebetween) are varied, (2) a method by which an aperture within the scanning direction (a length in the scanning direction) of the reticle blind 105B for regulating the illumination area IAR (exposure area IA) is varied, (3) a method by which a ratio between an opening time and a closing time of a shutter (not shown) for opening and closing an illumination light path at a high speed is varied, and (4) a method by which the density (transmittance) of the variable ND filter 104 or the intensity of light emission of the exposure light source is varied so as to change the intensity of the illumination light IL for irradiating the reticle R (wafer W). When the illumination light IL is pulse light (excimer laser light, or the like), there are methods including (5) a method by which an oscillation frequency of the pulse light source or the scanning speeds, etc., of the reticle R and the wafer W are varied to change the number of pulses to be applied onto the wafer while one point on the wafer intersects the projected image 142 (on the exposure area IA), (6) a method by which the aperture width in the scanning direction (a length in the scanning direction) of the reticle blind 105B for regulating the illumination area IAR (exposure area IA) is varied, (7) a method by which the density (transmittance) of the variable ND filter 104 is varied or an applied voltage (or a charged voltage) to be applied to the pulse light source is adjusted to change the intensity of pulse light oscillated from said light source, so as to change the intensity of the pulse light for irradiating the reticle R (wafer W).

Figure 14A:
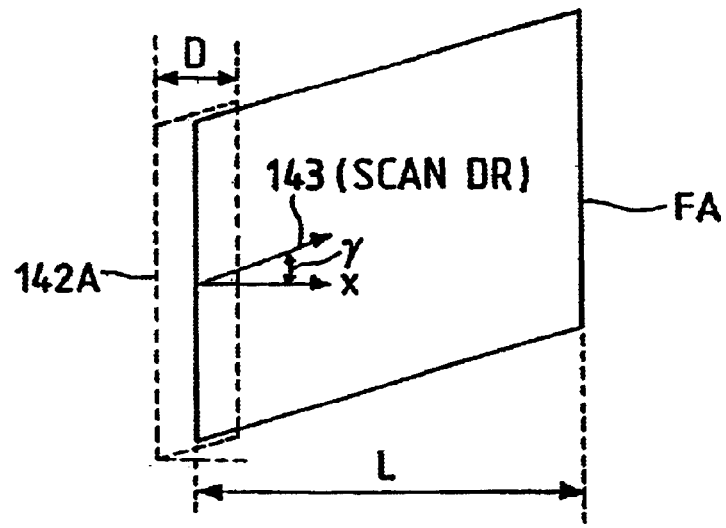
FIG. 14A is a drawing to show a relationship between an exposure area in a slit shape and a projected image on the entire shot area after the scanning exposure when a distortion in the form of a parallelogram is generated.
Figure 14B:
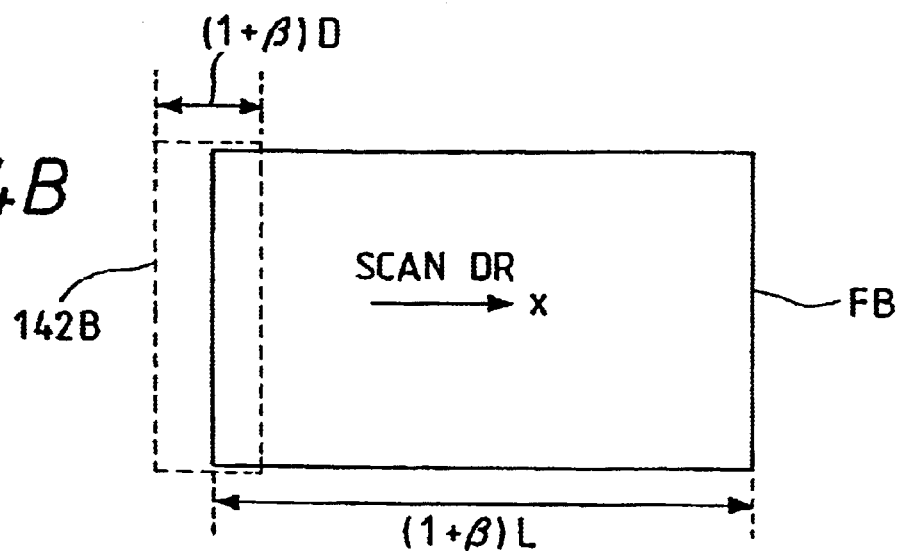
FIG. 14B is a drawing to show a relationship between an exposure area in a slit shape and a projected image on the entire shot area after the scanning exposure when a distortion in a rectangular shape is generated.
Figure 15A:
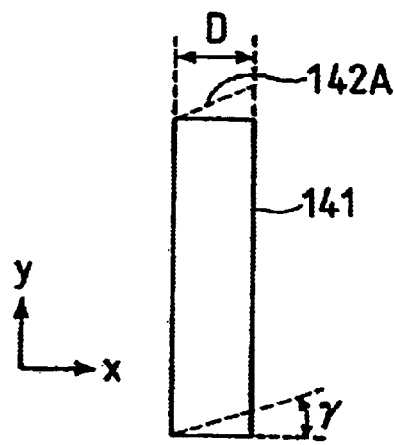
FIG. 15A is a drawing to show a distortion in the form of parallelogram of a projected image.
Figure 15B:
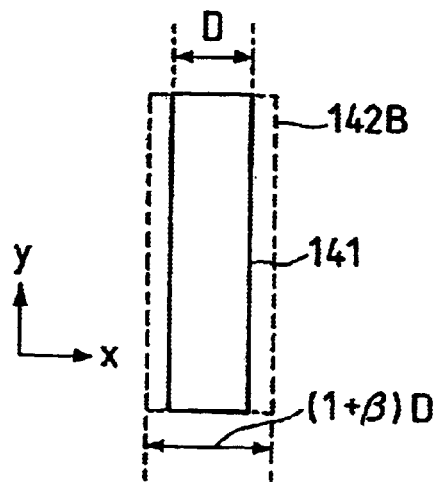
FIG. 15B is a drawing to show a distortion in a rectangular shape of the projected image.
Figure 15C:
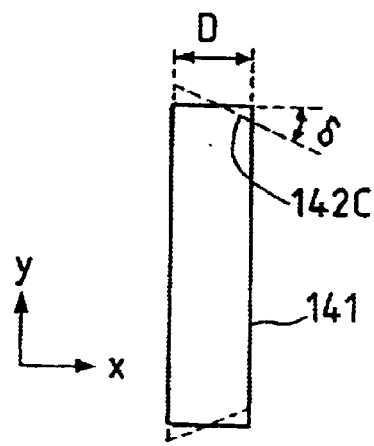
FIG. 15C is a drawing to show a distortion in a trapezoidal shape of the projected image.

Next, it is assumed that the exposure area IA having the width D in the scanning direction when there is no distortion becomes the exposure area 142B in the rectangular shape having the width (1+$\beta$) D in the scanning direction, as shown in FIG. 14B, because of the distortion $\beta$ in the rectangular shape of the projected image. In this case, in addition to correction of the isotropic magnification error $\alpha$ mentioned above, the ratio between the scanning speed of the reticle R and that of the wafer W is finely adjusted only by the rectangular distortion $\beta$. In this case, if the width of the projected image exposed on the entire surface of the shot area on the wafer in the scanning direction is L when there is no distortion, the width of the scanning direction of the projected image FB to be exposed after said correction becomes (1+$\beta$) L.

Though the wafer W is relatively moved with respect to the exposure area in the x direction at the scanning exposure, the wafer W is fixed in FIG. 14B for convenience's sake and the exposure 142B is moved in the +x direction on said wafer W. Therefore, also in FIG. 14B, the wafer W is actually moved in −x direction. Yet, in the following description, the exposure area is expressed as if moving on the wafer W in the drawing, for the convenience's sake.

It is also assumed that the exposure area having the width D when there is no distortion becomes the exposure area 142A in the shape of a parallelogram which is inclined by the angle $\gamma$[rad] with respect to the x direction, as shown in FIG. 14A, because of the distortion $\gamma$ in parallelism. In this case, a relative angle between the scanning direction of the reticle R and that of the wafer W is set to be γ. Therefore, if, for example, the reticle R is moved in parallel to the +x direction, the wafer W is moved in a direction which is inclined only by the angle γ with respect to the −x direction, and the exposure area 142A is scanned in the direction indicated by the arrow 143. Thus, deterioration in the resolution caused by the distortion in parallelism can be eliminated. In this case, a pattern image FA which is formed after the correction is inclined by the angle γ relative to the axis x.

Next, correction on the distortion in the trapezoidal shape (trapezoidal degrees $K_1$ and $K_2$) will be described below. The distortion in the trapezoidal shape is divided into a component which has a magnification varying in the scanning direction, as shown in FIG. 8, and a component which has a magnification varying in the non-scanning direction perpendicular to the scanning direction, as shown in FIG. 9. First, a method for correcting the distortion in the trapezoidal shape having the magnification varying in the scanning direction will be described with reference to FIG. 8.

Referring to FIG. 8, since a magnification of a projected image in the non-scanning direction (y direction) increases in a predetermined ratio in accordance with the exposure position x, the exposure area (projected image) IA gradually varies from the exposure area $IA_i$ at the start of the scanning operation to the exposure area $IA_f$ at the end of the exposure. In this case, the projection magnification of the projection optical system PL may be continuously changed as an application of the case in which the projection magnification varies isotropically, which was already described. That is, the projection magnification in the non-scanning direction is varied in accordance with the exposure position x which is changed by scanning so that a projected image formed in a shot area on the wafer W after the scanning exposure becomes a projected image 44A in the trapezoidal shape. Note that the projection magnification in the non-scanning direction may be varied continuously, or may be varied step by step during the exposure.

Also, the magnification in the scanning direction may be varied, in the same manner as the case in which the projection magnification varies isotropically, in such a manner that the speed of the wafer stage WST increases with an increase in the magnification, that is, in such a manner that the scanning speed $V_W$ of the wafer stage WST continuously increases along the straight line 46A to the positions x1 to x2 in FIG. 8. In addition, an amount of exposure on the wafer W which is a product of amounts of exposure on the respective points on the wafer W after the scanning exposure can be kept constant by effecting control such that an amount of exposure (intensity of illumination) EL per unit area within the exposure are IA gradually increases along the straight line 46B.

In brief, it is required for the main control system 120 to perform the following operations including (1) driving of the lens element 127, (2) controlling of the speed of the wafer stage WST, and (3) controlling of the density of the variable ND filter 104, during the scanning exposure in accordance with a measured value by the interferometer 116 on the reticle side. (However, the other method described before may be adapted for the operation (3)).

With respect to this, there is a mechanism for correcting, for example, the distortion only of the magnification component. However, in an exposure apparatus which can not correct a distortion in a trapezoidal shape (in which the lens element 127, for example, can move only in parallel along the optical axis AX and can not move in an inclined manner), by using the method by which only the magnification component is changed while the exposure areas $IA_i$, $IA_f$ remain in rectangular shapes, it is possible to correct an overlay error between the projected image after the scanning exposure and the shot area caused by said distortion to some extent, but not completely. In this case, since said error becomes smaller as the width of the exposure area in the scanning direction becomes smaller, it is desired to perform the scanning exposure by reducing said width.

Next, description will be made on a method for correcting the distortion in a trapezoidal shape which has a magnification varying in the non-scanning direction perpendicular to the scanning direction with reference to FIG. 9. In this case, it is required to change the speed ratio between the reticle R and the wafer W in the non-scanning direction since the projection magnification in the non-scanning direction is different in accordance with the position x in the scanning direction. That is, the scanning exposure is performed by rotating the wafer W (or the reticle R). More specifically, as shown in FIG. 9, the relative angle between the scanning direction of the reticle R and that of the wafer W may be gradually changed as the position of the exposure area is changed by the scanning from $IA_i$ to $IA_m$, and to $IA_f$. However, strictly speaking, the projected image is distorted in a fan shape on the wafer under the methods of the present embodiment so that a little deterioration in the image quality remains.

According to this method, as the relative angle between the reticle R and the wafer W is changed, the scanning speed $V_W$ of the wafer W (as a result, the relative speed of the wafer W) in the portion (y1 in FIG. 9) having a large magnification is faster, compared with the portion (y2 in FIG. 9) having a small magnification, whereby the magnification in the scanning direction is corrected. With respect to an amount of exposure on the wafer W, as the exposure area varies in the non-scanning direction, the density (transmittance) of the variable ND filter 104 may be controlled in such a manner that the intensity of illumination EL of the exposure area increases downward (−y direction), as indicated by the straight line 47 in FIG. 9. Or, the reticle R may be illuminated by varying, for example, the shape of the aperture portion of the reticle blind 105B in such a manner that the width of the exposure area in the scanning direction becomes wider in a lower part in FIG. 9.

As seen from FIGS. 14A and 14B, FIG. 8, and FIG. 9, according to the present embodiment, though no deterioration occurs in the image quality of a pattern after the scanning exposure, the projected images FA, FB, 44A and 44B on the shot area are distorted according to the distortion of the exposure area IA of the projection optical system, which does not become a problem when all of the layers on the wafer or only one layer is exposed by one projection exposure apparatus at the time of manufacturing a semiconductor device, etc. However when, for example, each layer is exposed by a plurality of projection exposure apparatuses- (for example, at the time of mixing and matching), an overlay accuracy among the layers on the wafer becomes degraded.

For this reason, when the mixing and matching operation is to be performed, it is desired to depict a pattern of each reticle in advance so as to offset an anisotropic distortion of the projection optical system in each projection exposure apparatus. That is, if a pattern on each reticle is depicted as distorted in a direction opposite to that of the distortion of a projected image of a corresponding projection optical system in advance, a projected image formed on the entire surface of the shot area on the wafer by the scanning exposure has no distortion, thereby improving the overlay accuracy.

In the foregoing embodiments, a refraction system is used as the projection optical system. However, the present invention is applied when a projection optical system comprising a reflection system or a reflective refraction system is used. Also, though the exposure area on the wafer is in a rectangular shape in the foregoing embodiment, the present invention can be applied when said exposure area is, for example, in an arc.

As described, the present invention may have various arrangements without being limited to the above-described embodiments and without departing from the scope of the invention.

What is claimed is:

1. A scanning exposure apparatus in which a mask and a substrate are moved in respective scanning directions during scanning exposure, the apparatus comprising:
   a scanning system having a mask stage, a substrate stage, a mask interferometer system which detects positional information of the mask stage, and a substrate interferometer system which detects positional information of the substrate stage, which moves the mask and the substrate synchronously relative to exposure light from an illumination system;
   an optical device disposed in the illumination system, which defines an illumination area of the exposure light; and
   an optical filter arranged in the illumination system, which changes intensity distribution of the exposure light within the illumination area in a direction perpendicular to the scanning direction.

2. A scanning exposure apparatus according to claim 1, wherein the optical device changes shape and size of the illumination area.

3. A scanning exposure apparatus according to claim 2, wherein the optical device includes movable members.

4. A scanning exposure apparatus according to claim 1, wherein relative relationship between the scanning direction of the mask and the scanning direction of the substrate is controlled based on the positional information of the mask and substrate interferometer systems.

5. A scanning exposure apparatus according to claim 1, wherein during the scanning exposure, relative speed between the mask and the substrate is adjusted.

6. A scanning exposure apparatus according to claim 5, wherein during the scanning exposure, an image projected onto the substrate via a projection system is adjusted.

7. A scanning exposure apparatus according to claim 1, further comprising:
   a projection system; and
   an image adjustment system which adjusts a magnification of the projection system in accordance with a size of a pattern on the substrate in the direction perpendicular to the scanning direction, and which adjusts a relative speed between the mask and the substrate in accordance with the size of the pattern on the substrate in the scanning direction.

8. A scanning exposure apparatus according to claim 1, further comprising:
   an adjustment system which adjusts a pattern to be formed on the substrate in accordance with distortion of a pattern on the substrate,
   wherein the optical filter changes the intensity distribution in accordance with an operation of the adjustment system.

9. A scanning exposure apparatus according to claim 8, wherein the adjustment system changes a shape of the illumination area of the exposure light.

10. A scanning exposure apparatus according to claim 9, wherein the adjustment system changes, during the scanning exposure, a relative angle between the mask and the substrate.

11. A scanning exposure apparatus according to claim 8, wherein the adjustment system changes, during the scanning exposure, a relative angle between the mask and the substrate.

12. A scanning exposure apparatus according to claim 8, wherein the pattern formed on the substrate has trapezoidal distortion.

13. A scanning exposure apparatus according to claim 8, wherein the distortion of the pattern on the substrate is determined based on information obtained by detecting marks on the substrate.

14. A scanning exposure apparatus according to claim 13, wherein the adjustment system changes a shape of the illumination area of the exposure light.

15. A scanning exposure apparatus according to claim 13, wherein the adjustment system changes a relative angle between the mask and the substrate.

16. A scanning exposure apparatus according to claim 15, wherein the adjustment system changes a shape of the illumination area of the exposure light.

* * * * *